United States Patent
Chen et al.

(10) Patent No.: US 11,594,709 B2
(45) Date of Patent: Feb. 28, 2023

(54) METHOD OF MANUFACTURING DISPLAY DEVICE

(71) Applicant: Samsung Display Co., Ltd., Yongin-si (KR)

(72) Inventors: Jonghwan Chen, Yongin-si (KR); Jeongsu Kim, Yongin-si (KR); Jinsoo Kim, Yongin-si (KR); Dongseok Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 202 days.

(21) Appl. No.: 17/171,249

(22) Filed: Feb. 9, 2021

(65) Prior Publication Data

US 2022/0013751 A1     Jan. 13, 2022

(30) Foreign Application Priority Data

Jul. 7, 2020    (KR) ........................ 10-2020-0083607

(51) Int. Cl.
    *H01L 51/56*     (2006.01)
    *H01L 51/00*     (2006.01)

(52) U.S. Cl.
    CPC .......... *H01L 51/56* (2013.01); *H01L 51/0027* (2013.01)

(58) Field of Classification Search
    CPC ............................ H01L 51/56; H01L 51/0027
    See application file for complete search history.

(56) References Cited

U.S. PATENT DOCUMENTS

| | | | | |
|---|---|---|---|---|
| 7,919,395 | B2 * | 4/2011 | Morikazu | B23K 26/40 |
| | | | | 438/460 |
| 9,093,518 | B1 * | 7/2015 | Lei | H01L 24/92 |
| 9,123,794 | B2 * | 9/2015 | Amano | H01L 21/78 |
| 9,147,599 | B2 * | 9/2015 | Nakajima | H01L 21/187 |
| 9,165,832 | B1 * | 10/2015 | Papanu | H01L 21/67207 |
| 9,349,648 | B2 * | 5/2016 | Lei | H01L 21/02057 |
| 9,412,619 | B2 * | 8/2016 | Kumar | H01L 21/67748 |
| 9,446,479 | B2 * | 9/2016 | Wei | B23K 26/324 |
| 9,576,835 | B2 * | 2/2017 | Wei | H01L 21/6836 |

(Continued)

FOREIGN PATENT DOCUMENTS

| | | |
|---|---|---|
| JP | 2002-103459 A | 4/2002 |
| KR | 10-1122240 B1 | 3/2012 |

(Continued)

*Primary Examiner* — Caleb E Henry
(74) *Attorney, Agent, or Firm* — Lewis Roca Rothgerber Christie LLP

(57) ABSTRACT

Provided is a method of manufacturing a display device, in which a defective rate of a display substrate is reduced by, prior to main processing, irradiating a laser to a portion of a processing area of a display substrate, and predicting and correcting a location to which the laser is irradiated. The method includes irradiating a first laser to a first irradiation area of a processing area of a display substrate, obtaining a first image of the processing area of the display substrate, calculating a first displacement between a center of the first irradiation area irradiated with the first laser and a center of the processing area by using the first image, determining a second irradiation area to which a second laser is to be irradiated on the display substrate based on the first displacement, and irradiating the second laser to the second irradiation area.

23 Claims, 16 Drawing Sheets

(56) References Cited

U.S. PATENT DOCUMENTS

| | | | | |
|---|---|---|---|---|
| 9,688,533 | B2* | 6/2017 | Bozorgi | B23K 26/0622 |
| 9,704,984 | B2* | 7/2017 | Hirler | H01L 29/66712 |
| 2008/0217312 | A1* | 9/2008 | Tokura | B81C 1/00896 |
| | | | | 219/121.72 |
| 2014/0038392 | A1* | 2/2014 | Yonehara | H01L 33/0093 |
| | | | | 438/463 |
| 2014/0126167 | A1* | 5/2014 | Bozorgi | B23K 26/32 |
| | | | | 219/121.64 |
| 2014/0305916 | A1* | 10/2014 | Wei | B23K 26/324 |
| | | | | 219/121.64 |
| 2015/0140735 | A1* | 5/2015 | Hosseini | B23K 26/356 |
| | | | | 438/107 |
| 2016/0238855 | A1* | 8/2016 | Kriman | G02B 5/1814 |

FOREIGN PATENT DOCUMENTS

| | | |
|---|---|---|
| KR | 10-1283557 B1 | 7/2013 |
| KR | 10-1778088 B1 | 9/2017 |
| KR | 10-1913580 B1 | 11/2018 |

* cited by examiner

METHOD OF MANUFACTURING DISPLAY DEVICE

CROSS-REFERENCE TO RELATED APPLICATION

This application claims priority to, and the benefit of, Korean Patent Application No. 10-2020-0083607, filed on Jul. 7, 2020, in the Korean Intellectual Property Office, the disclosure of which is incorporated by reference herein in its entirety.

BACKGROUND

1. Field

One or more embodiments relate to a method of manufacturing a display device.

2. Description of the Related Art

Display devices visually display data. Display devices may be used as displays of small-sized products, such as mobile phones, or may be used as displays of large-sized products, such as televisions.

Display devices include a plurality of pixels that receive electrical signals, and emit light to display images to the outside. Each of the pixels includes a light-emitting element. For example, an organic light-emitting display device includes an organic light-emitting diode (OLED) as a light-emitting element. In general, in an organic light-emitting display device, thin-film transistors and OLEDs are arranged on a substrate, and the OLEDs emit light by themselves (e.g., are self-illuminating).

Recently, as the use of display devices has increased, various designs for improving the quality of display devices have been developed. For example, display devices may include a transmission area in which a camera, a sensor, etc. may be arranged, inside a display area in which images are displayed. To form such a transmission area, the display devices may be irradiated with a laser, and studies on designs for forming a transmission area by irradiating a laser within a preset processing area have been conducted. Further, various studies have been attempted to increase processing precision using a laser.

SUMMARY

However, an area to which a laser is irradiated on a display substrate is not predictable (e.g., with a high degree of precision) by using methods of manufacturing such display devices of the related art.

One or more embodiments provide a method of manufacturing a display device in which a defect/defective rate of a display substrate is reduced by irradiating a laser to a portion of a processing area (e.g., a preset processing area) of a display substrate, and predicting and correcting a location to which the laser is irradiated. However, this is merely an example, and the scope of the disclosure is not limited thereby.

Additional aspects will be set forth in part in the description which follows and, in part, will be apparent from the description, or may be learned by practice of the presented embodiments.

According to one or more embodiments, a method of manufacturing a display device includes irradiating a first laser to a first irradiation area of a processing area of a display substrate, obtaining a first image of the processing area of the display substrate, calculating a first displacement between a center of the first irradiation area irradiated with the first laser and a center of the processing area by using the first image, determining a second irradiation area to which a second laser is to be irradiated on the display substrate based on the first displacement, and irradiating the second laser to the second irradiation area.

The method may further include obtaining a second image showing the second irradiation area.

The method may further include calculating a second displacement between a center of the second irradiation area and the center of the processing area using the second image.

The first irradiation area and the second irradiation area may have a circular shape.

A diameter of the first irradiation area may be smaller than a diameter of the second irradiation area.

The method may further include determining shapes of the first irradiation area and the second irradiation area by changing directions in which the first laser and the second laser are irradiated.

The first irradiation area may have a ring shape or a cross shape.

The display substrate may include cells, wherein the first laser is provided as a plurality of first lasers, and wherein the irradiating of the first laser to the first irradiation area includes substantially simultaneously irradiating the plurality of first lasers to cells located in a first column among the cells.

The second laser may be provided as a plurality of second lasers, wherein the irradiating of the second laser to the second irradiation area includes substantially simultaneously irradiating the plurality of second lasers to the cells located in the first column.

The obtaining of the first image of the processing area may include sequentially obtaining a plurality of first images of areas of the cells in the first column.

The method may further include sequentially in a first direction obtaining the first images of areas of the cells in the first column, and sequentially in a second direction obtaining the first images of areas of the cells in a second column among the cells, wherein the second direction is opposite to the first direction.

The method may further include determining the second irradiation area using a laser scanner.

The method may further include moving the display substrate in a third direction that is different from a direction in which one of the first laser or the second laser is incident on a surface of the display substrate.

The method may further include irradiating one of the first laser or the second laser onto the display substrate while the display substrate is moved in the third direction.

The method may further include obtaining the first image while moving the display substrate in a fourth direction that is opposite to the third direction.

According to one or more embodiments, a method of manufacturing a display device includes irradiating a first laser to a first irradiation area of a processing area of a display substrate, which is attached to a lower surface of a transporter, by using a processor, obtaining a first image of the processing area by using a camera located in a first direction with respect to the processor, calculating a first displacement between a center of the first irradiation area and a center of the processing area by using the first image, transmitting the first displacement to the processor, determining, by the processor, a second irradiation area to which a second laser is to be irradiated on the display substrate based on the first displacement, and irradiating the second laser to the second irradiation area.

The first laser and the second laser may be irradiated onto a surface of the display substrate through a protective window between the processor and the display substrate.

The processor may include a light source and a laser scanner, wherein the laser scanner is adjusted based on the first displacement transmitted by the camera.

The method may further include moving the display substrate in the first direction using the transporter, wherein the obtaining of the first image is performed while the display substrate is moved in the first direction.

The processor may include a light source and a laser scanner, and wherein shapes of the first irradiation area and the second irradiation area are determined by the laser scanner.

The first irradiation area may have one of a circular shape, a ring shape, or a cross shape.

The first irradiation area and the second irradiation area may have a circular shape, wherein a diameter of the first irradiation area is smaller than a diameter of the second irradiation area.

The method may further include obtaining a second image of the processing area of the display substrate by using the camera, and calculating a second displacement between a center of a second irradiation area irradiated with the second laser and the center of the processing area by using the second image.

Other aspects, features, and advantages other than those described above will become apparent from the following detailed description, claims and drawings for carrying out the present embodiments.

These general and specific aspects may be practiced by using systems, methods, computer programs, or any combination thereof.

BRIEF DESCRIPTION OF THE DRAWINGS

The above and other aspects of certain embodiments will be more apparent from the following description taken in conjunction with the accompanying drawings, in which.

DETAILED DESCRIPTION

Figure 1:
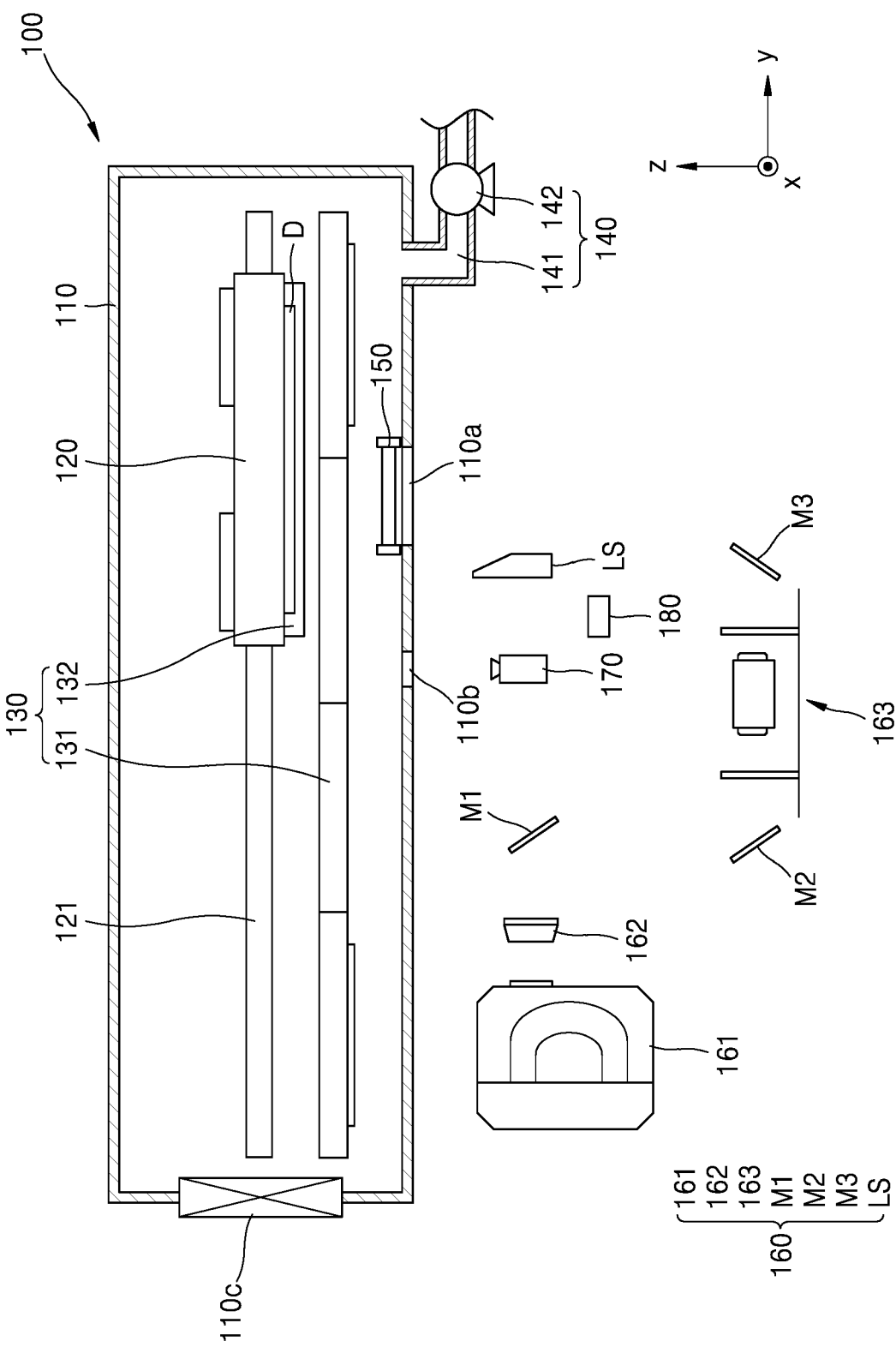
FIG. 1 is a schematic cross-sectional view of an apparatus for manufacturing a display device, according to some embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

One or more embodiments of the disclosure will be described below in more detail with reference to the accompanying drawings. Those elements that are the same or are in correspondence with each other are rendered the same reference numeral regardless of the figure number, and redundant explanations are omitted.

While such terms as "first," "second," etc., may be used to describe various elements, such elements are not to be limited to the above terms. The above terms are used only to distinguish one elements from another.

As used herein, the singular forms "a," "an," and "the" are intended to include the plural forms as well, unless the context clearly indicates otherwise.

It will be understood that the terms "including," "having," and "comprising" are intended to indicate the existence of the features, numbers, steps, actions, elements, parts, or combinations thereof described in the specification, and are not intended to preclude the possibility that one or more other features, numbers, steps, actions, elements, parts, or combinations thereof may exist or may be added.

It will be understood that when a layer, area, or element is referred to as being "formed on," another layer, area, or element, it may be directly or indirectly formed on the other layer, area, or element. That is, for example, intervening layers, areas, or elements may be present.

Sizes of elements in the drawings may be exaggerated for convenience of explanation. In other words, because sizes and thicknesses of elements in the drawings are arbitrarily illustrated for convenience of explanation, the following embodiments are not limited thereto.

When some embodiments may be implemented differently, a specific process order may be performed differently from the described order. For example, two consecutively described processes may be performed substantially at the same time or performed in an order opposite to the described order.

In the specification, the phrase "A and/or B" denotes A, B, or A and B. Also, the phrase "at least one of A and B" denotes A, B, or A and B.

In the following embodiments, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

The x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic cross-sectional view of an apparatus 100 for manufacturing a display device, according to some embodiments.

Referring to FIG. 1, the apparatus 100 for manufacturing a display device may include a chamber 110, a mover or transporter (e.g., a moving unit) 120, a guide (e.g., a guide unit) 121, a driver 130, a pressure controller (e.g., a pressure-adjusting unit) 140, a protective window 150, a processor (e.g., a processing unit) 160, a camera (e.g., an image-capturing unit, or a vision unit) 170, and a controller 180. The processor 160, the camera 170, and the controller 180 may each be fixed by a support.

The chamber 110 may define a space therein, and may be formed so that a portion thereof is open. A gate valve 110c may be installed in the open portion of the chamber 110 to selectively open and close the open portion of the chamber 110. Also, the chamber 110 may include a first transmissive window 110a and a second transmissive window 110b. Various equipment arranged outside the chamber 110 may process a surface of a display substrate D located inside the chamber 110 or may obtain an image of the surface of the display substrate D through the first transmissive window 110a and/or the second transmissive window 110b. That is, the first transmissive window 110a and the second transmissive window 110b may function as media connecting the outside and the inside of the chamber 110. Although FIG. 1 illustrates two transmissive windows, the number of transmissive windows may be greater than or equal to two. As an example, the first transmissive window 110a and the second transmissive window 110b may include glass or acryl.

The transporter 120 to which the display substrate D may be attached may move in a y-direction using the guide 121 and the driver 130. The transporter 120 may move in a straight line without inclining by using the guide 121. As an example, the guide 121 may be a linear-motion (LM) guide. Although FIG. 1 illustrates one guide 121, when viewed in the x-y plane, two guides 121 each extending in the y-direction and arranged parallel to each other may be arranged in other embodiments.

The driver 130 may include a linear motor system (LMS) magnet 131 and a magnetic body 132. Although FIG. 1 illustrates one LMS magnet 131 and one magnetic body 132, when viewed in the x-y plane, two LMS magnets 131 and two magnetic bodies 132 each extending in the y-direction and arranged parallel to each other may be arranged. The display substrate D may be between the two magnetic bodies 132. A linear motor may be formed by combining the LMS magnet 131 and the magnetic body 132, and the transporter 120 may move in the y-direction by the linear motor. As an example, the magnetic body 132 may be a coil. When the transporter 120 moves along the driver 130, the transporter 120 may move using a magnetic levitated wireless charging system. The transporter 120 may include a position actuator (e.g., a position-adjusting unit) that changes a position of the display substrate D or that finely adjusts a position of the transporter 120.

The display substrate D attached to the transporter 120 may be a display device or a portion of the display device. For example, the display substrate D may include a thin-film transistor (TFT) and an organic light-emitting diode (OLED).

The pressure controller 140 may be connected to the chamber 110 to adjust an internal pressure of the chamber 110 to be, for example, similar to atmospheric pressure, or similar to a vacuum. In this case, the pressure controller 140 may include a connection pipe 141 connected to the chamber 110 and a pressure control pump 142 arranged in the connection pipe 141.

The protective window 150 may overlap the first transmissive window 110a and may be arranged in the chamber 110. The protective window 150 may protect the first transmissive window 110a. The first transmissive window 110a may correspond to a portion through which a laser emitted from the processor 160 passes, as will be described later. In this case, the laser emitted from the processor 160 may reach the display substrate D through the first transmissive window 110a, and may remove a portion of an organic layer included in the display substrate D. Particles from the portion of the organic layer that are separated from the display substrate D by the laser may be distributed inside the chamber 110, and may adhere to a surface of the first transmissive window 110a through which the laser passes. The laser passing through the first transmissive window 110a may not reach a target point by reacting sensitively to foreign substances that are adhered to the surface of the first transmissive window 110a. Therefore, the protective window 150 may be arranged inside the chamber 110 so that foreign substances do not adhere to the surface of the first transmissive window 110a, thereby protecting the first transmissive window 110a.

Also, when the inside of the chamber 110 is in a high vacuum state as controlled by the pressure controller 140, only the protective window 150 is replaced while maintaining the inside of the chamber 110 in the high vacuum state, and thus the first transmissive window 110a and the protective window 150, which are portions through which a laser passes, may be kept clean without foreign substances. Replacing only the protective window 150 while maintaining the inside of the chamber 110 in the high vacuum state may include various methods, such as separately providing a vacuum chamber including a clean protective window 150 and replacing the protective window 150 using a gate valve.

Conventionally, when the protective window 150 is not used, a surface of a transmissive window may be kept clean by directly washing the transmissive window after changing the internal pressure of the chamber to atmospheric pressure. In this case, because it is suitable to directly wash the transmissive window and to change the internal pressure of the chamber to the high vacuum state again, a processing time for a display substrate may increase.

However, when the protective window 150 is arranged by overlapping the first transmissive window 110a according to some embodiments of the present disclosure, the first transmissive window 110a and the protective window 150 may be kept clean by replacing only the protective window 150 while maintaining the internal pressure of the chamber 110 in the high vacuum state, thereby shortening the processing time.

The processor 160 may include a laser light source (e.g., a laser light source unit) 161, a laser beam dump (e.g., a laser beam sink) 162, first to third mirrors (e.g., mirror units) M1, M2, and M3, an optical component 163, and a laser scanner LS. The processor 160 may be arranged outside the chamber 110, and may irradiate a laser onto a surface of the display substrate D through the first transmissive window 110a. Maintaining the inside of the chamber 110 in the high vacuum state by the pressure controller 140 may prevent malfunction and damage of the processor 160.

The laser light source 161 may serve to generate and output a laser. Accordingly, the laser light source 161 may adjust a frequency at which the laser is emitted and/or an intensity of the laser.

The laser beam dump 162 may be arranged adjacent to the laser light source 161 to absorb and dissipate a laser output from the laser light source 161. That is, the laser beam dump 162 may serve to select whether to continue outputting the laser from the laser light source 161. Although FIG. 1 illustrates that the laser beam dump 162 is arranged in a direction in which a laser proceeds from the laser light source 161, the laser beam dump 162 may be omitted in other embodiments.

The laser output from the laser light source 161 may sequentially reach the first to third mirrors M1, M2, and M3. The direction in which the laser proceeds may be changed by the first to third mirrors M1, M2, and M3. As an example, an angle at which the laser is reflected may be changed by adjusting angles of the first to third mirrors M1, M2, and M3, and thus the direction in which the laser proceeds may be changed. When adjusting the angles of the first to third mirrors M1, M2, and M3, the first to third mirrors M1, M2, and M3 may be rotated.

A laser that reaches each of the first and second mirrors M1 and M2 may pass through the optical component 163. The optical component 163 may change a shape and/or a quality of the laser. The optical component 163 may include a laser-beam-size adjuster, a laser-beam-power adjuster, etc., and may adjust a size of the laser and a power at which the laser is emitted. As an example, the laser-beam-size adjuster may be a beam expander. Although FIG. 1 illustrates that the optical component 163 is between the second mirror M2 and the third mirror M3, the optical component 163 may be between the first mirror M1 and the second mirror M2. As shown in FIG. 1, the optical component 163 may be protected by being arranged between protective layers extending in a z-direction.

A laser passing through the optical component 163 may reach the laser scanner LS through the third mirror M3. The laser scanner LS may adjust a location to which the laser is to be finally irradiated (e.g., may adjust coordinates corresponding to the laser). The laser scanner LS may include a galvanometer scanner, which is a fine adjusting motor (e.g., a motor capable of fine tuning), and a mirror attached to the galvanometer scanner. When an angle of the mirror is adjusted by using the galvanometer scanner, a location to which the laser is to be irradiated may be adjusted. Also, because the location to which the laser is to be irradiated may be adjusted by the laser scanner LS, a shape of a processed area using the laser may be changed. As an example, the processed area by the laser may have a circular shape, a ring shape, or a cross shape. In addition to the aforementioned shapes, the processed area may have various shapes.

The surface of the display substrate D attached to the transporter 120 may be observed through the camera 170, and an image of the surface of the display substrate D may be obtained. The camera 170 may observe the entire surface of, or a portion of the surface of, the display substrate D. Also, the camera 170 may continuously capture a location of an object to be observed even while the display substrate D is moved by the transporter 120. Although the camera 170 is described as a camera, the camera may be replaced in other embodiments by any suitable light-detecting unit.

The camera 170 may be arranged outside the chamber 110, and may observe the surface of the display substrate D through the second transmissive window 110b. By maintaining the inside of the chamber 110 in the high vacuum state by the pressure controller 140, the likelihood of malfunction and damage of the camera 170 may be reduced or prevented.

The controller 180 may analyze the image of the surface of the display substrate D, which is obtained using the camera 170, and may transmit the analyzed image to the laser scanner LS of the processor 160.

Figure 2:
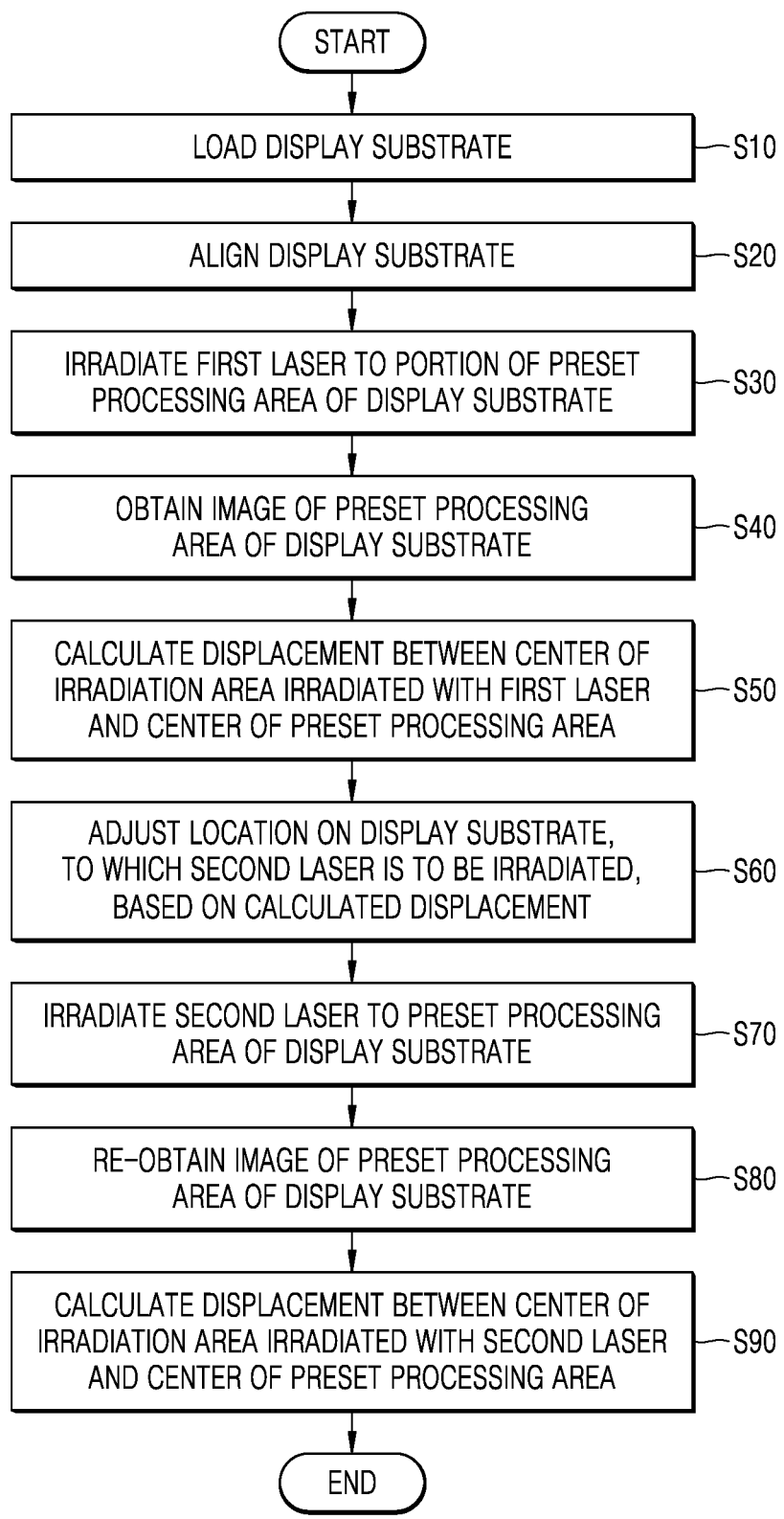
FIG. 2 is a flowchart of a method of manufacturing a display device, according to some embodiments.

FIG. 2 is a flowchart of a method of manufacturing a display device, according to some embodiments, FIGS. 3, 4A, 5A, 6A, and 7A are schematic cross-sectional views sequentially showing a method of manufacturing a display device, according to some embodiments, and FIGS. 4B, 5B to 5D, 6B, and 7B are schematic plan views illustrating a method of manufacturing a display device in detail, according to some embodiments.

Referring to FIG. 2, the method of manufacturing the display device may include irradiating a first laser to a portion of a processing area (e.g., a preset processing area) of the display substrate D (S30), obtaining an image of the processing area of the display substrate D (S40), calculating a displacement between a center of an irradiation area irradiated with the first laser and a center of the processing area by using the image obtained in the previous operation (S50), adjusting a location to which a second laser is to be irradiated on the display substrate D based on the displacement calculated in the previous operation (S60), and irradiating the second laser to the processing area of the display substrate D (S70).

Also, the method of manufacturing the display device may further include loading the display substrate D (S10) and aligning the display substrate D (S20), prior to the irradiating of the first laser onto the display substrate D (S30), in some embodiments. Additionally, after the irradiating of the second laser onto the display substrate D (S70), re-obtaining an image of the processing area of the display substrate D (S80), and calculating a displacement between a center of an irradiation area irradiated with the second laser and the center of the processing area (S90) may be sequentially performed in some embodiments. As another example, the re-obtaining of the image of the processing area of the display substrate D (S80) and/or the calculating the center of the irradiation area irradiated with the second laser and the center of the processing area (S90) may be omitted.

Hereinafter, the method of manufacturing the display device according to some embodiments will be described in detail with reference to FIGS. 3 to 7B. In FIGS. 3 to 7B, the same reference numerals as those in FIG. 1 denote the same members as those in FIG. 1, and repeated descriptions thereof will be omitted.

Figure 3:
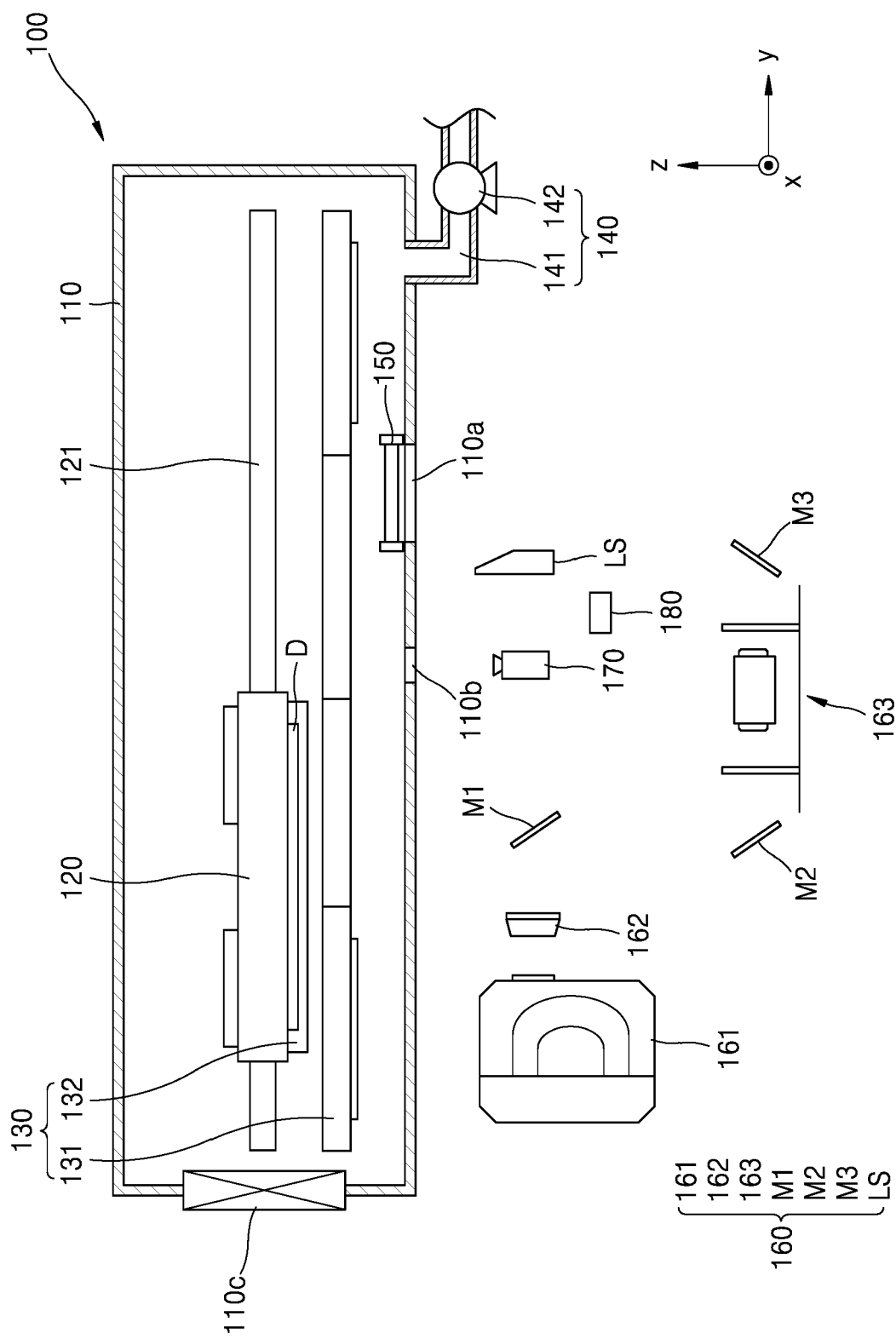
FIG. 3 is a schematic cross-sectional view of a method of manufacturing a display device, according to some embodiments.

Referring to FIG. 3, the pressure controller 140 may maintain the inside of the chamber 110 at or around atmospheric pressure, and the display substrate D attached to the transporter 120 may be inserted into the chamber 110 (S10) after the gate valve 110c is opened. Thereafter, the pressure controller 140 may maintain the inside of the chamber 110 to be substantially similar to vacuum (e.g., to a vacuum state).

After the loading of the display substrate D (S10) is performed, the aligning of the display substrate D (S20) may be performed. In some embodiments, an alignment camera may be arranged inside or outside the chamber 110, and the display substrate D may be aligned using an image of the display substrate D captured by the alignment camera. For example, an alignment key may be indicated at each vertex of the display substrate D, and the alignment camera may capture the alignment key indicated at each vertex of the display substrate D. When the display substrate D is inclined or twisted, the alignment key is not completely captured by the alignment camera, and thus the display substrate D may be aligned using an image captured by the alignment camera. That is, the display substrate D may be aligned by moving the display substrate D so that the alignment key is completely captured by the alignment camera.

Figure 4A:
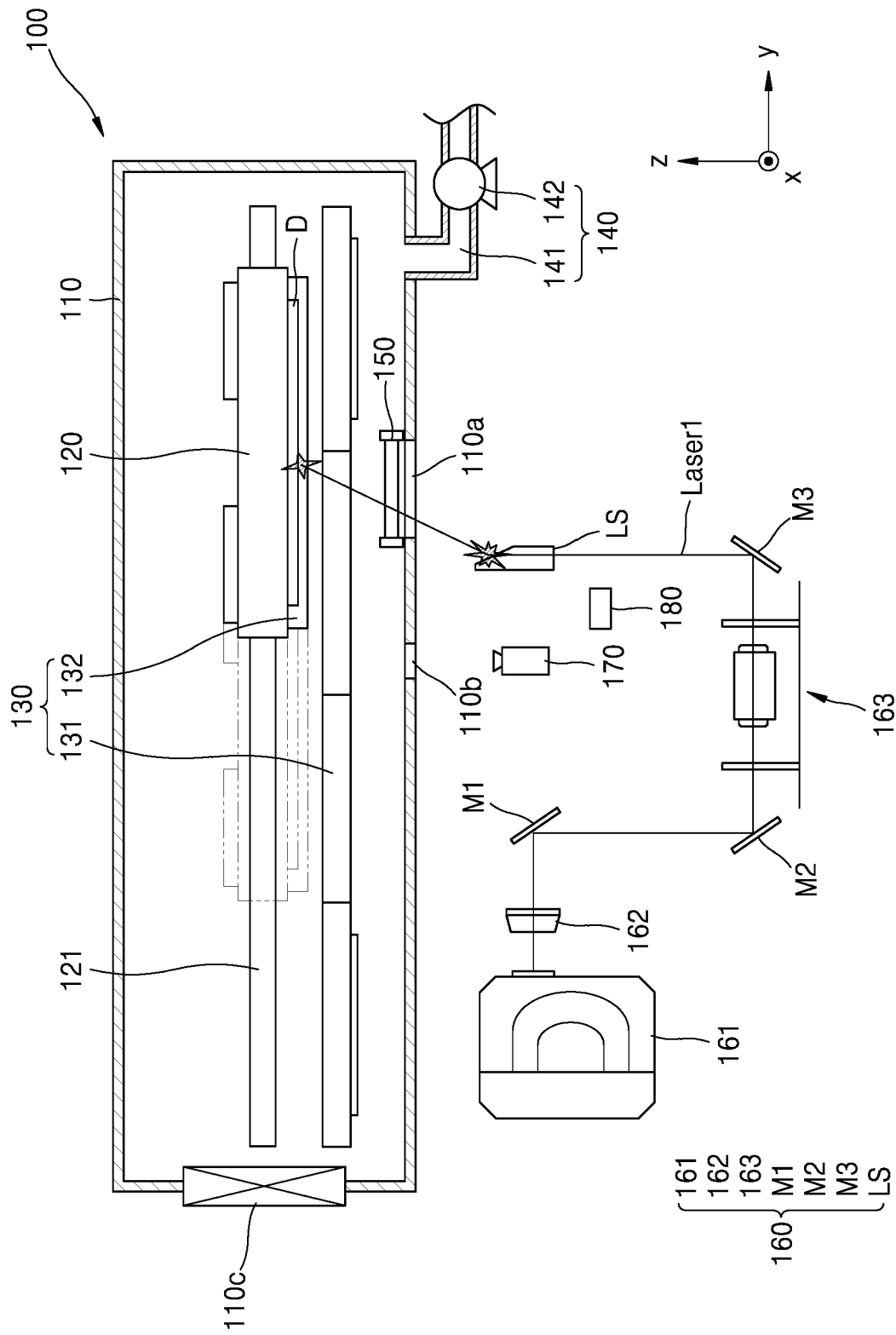
FIG. 4A is a schematic cross-sectional view of a method of manufacturing a display device, according to some embodiments.

Referring to FIG. 4A, after the aligning of the display substrate D (S20) is performed, the display substrate D may be moved in a first direction (e.g., +y direction) at, for example, a constant speed. In this case, the first direction may be different from a direction in which a first laser Laser1 is incident on the display substrate D. The display substrate D may become adjacent to the first transmissive window 110a of the chamber 110, and irradiating the first laser Laser1 to a portion of a processing area AR1 (e.g., see FIGS. 4B, 5B, 5C, 5D, 6B, and 7B) of the display substrate D (S30) may be performed. Although FIG. 4A illustrates that the first laser Laser1 passes through the LMS magnet 131, as described in FIG. 1, it may be understood that the transporter 120 is movable using two or more LMS magnets 131 that are spaced apart from each other, and that the first laser Laser1 may proceed to an empty space between respective LMS magnets 131 that are spaced apart from each other.

Figure 4B:
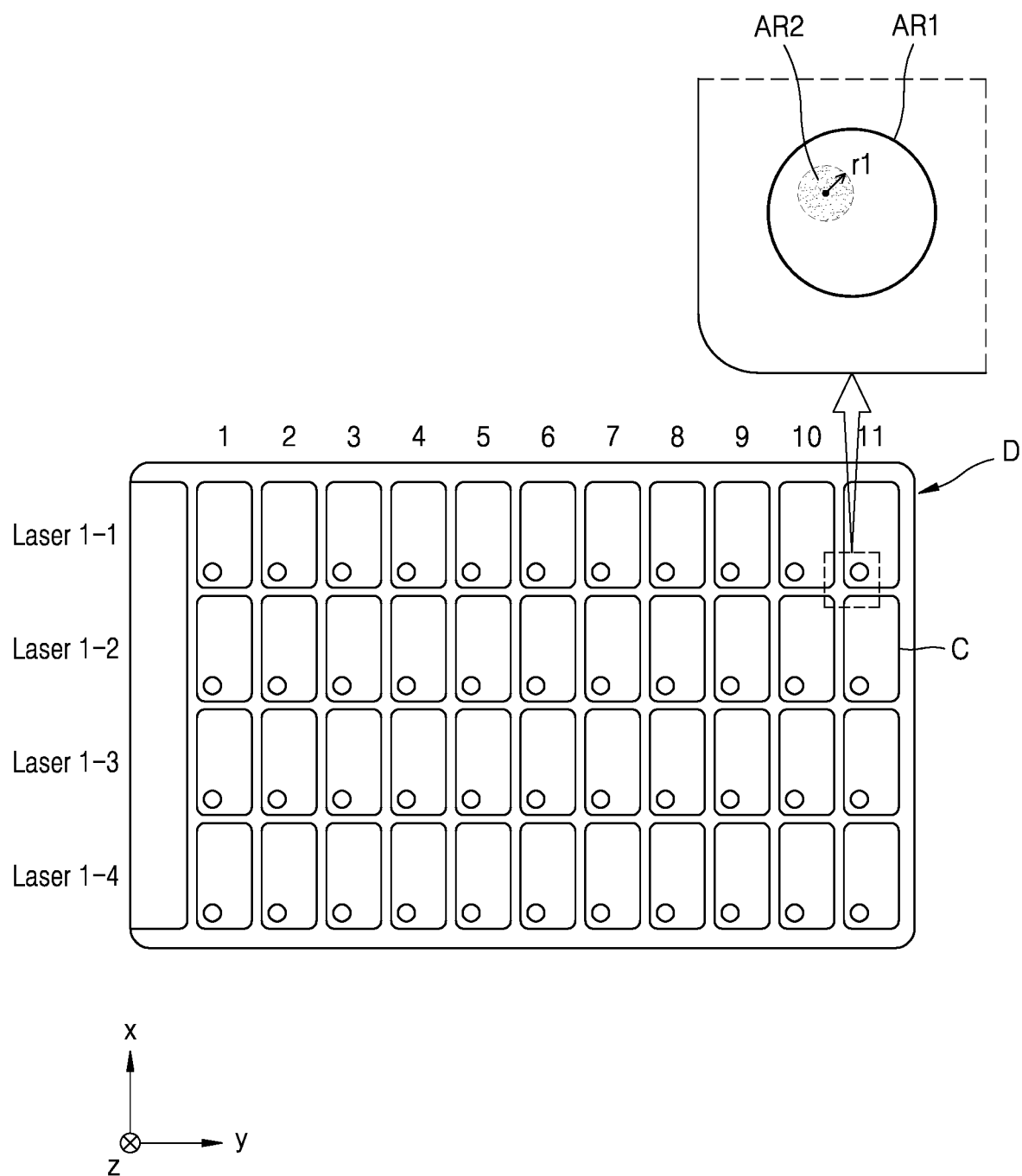
FIG. 4B is a schematic plan view of a method of manufacturing a display device, according to some embodiments.

Before performing the irradiating of the first laser Laser1 to the portion of the processing area AR1 of the display substrate D (S30), a frequency at which the first laser Laser1 is emitted and/or an intensity of the first laser Laser1 may be adjusted by the laser light source 161, and/or a shape and/or a quality of the first laser Laser1 may be changed by the optical component 163. Also, a location at which the first laser Laser1 is to be irradiated onto the display substrate D may be adjusted by adjusting the galvanometer scanner of the laser scanner LS. That is, the first laser Laser1 may be irradiated to the portion of the processing area AR1 of the display substrate D by adjusting the galvanometer scanner of the laser scanner LS. As shown in FIG. 4B, a first irradiation area AR2 may be formed within the processing area AR1 of the display substrate D in which the first laser Laser1 is locally processed (e.g., concentrated).

The irradiating of the first laser Laser1 to the portion of the processing area AR1 of the display substrate D (S30) may be performed while the display substrate D is moved in the first direction (e.g., +y direction) at the constant speed, which may be referred to as "motion processing." As another example, when the display substrate D is moved in the first direction at the constant speed and reaches the processing area AR1 of the display substrate D, the display substrate D stops and the first laser Laser1 may be irradiated to the portion of the processing area AR1, which may be referred to as "step processing."

Referring to FIG. 4B, the first laser Laser1 may be provided as a plurality of first lasers Laser1. For example, as shown in FIG. 4B, there may be a total of four first lasers Laser1. That is, the first laser Laser1 may include a $(1-1)^{st}$ laser Laser1-1, a $(1-2)^{nd}$ laser Laser1-2, a $(1-3)^{rd}$ laser Laser1-3, and a $(1-4)^{th}$ laser Laser1-4.

Also, the display substrate D may include a plurality of cells C. The plurality of cells C may be arranged in a row direction (y-direction) and a column direction (x-direction). The plurality of cells C may each include a processing area AR1.

In some embodiments, as shown in FIG. 4B, a plurality of cells C arranged in a first row may be irradiated with the $(1-1)^{st}$ laser Laser1-1, a plurality of cells C arranged in a second row may be irradiated with the $(1-2)^{nd}$ laser Laser1-2, a plurality of cells C arranged in a third row may be irradiated with the $(1-3)^{rd}$ laser Laser1-3, and a plurality of cells C arranged in a fourth row may be irradiated with the $(1-4)^{th}$ laser Laser1-4.

As described in FIG. 4A, the display substrate D may be moved in the first direction (e.g., +y direction) at the constant speed. When the display substrate D is moved in the first direction, cells C arranged in an eleventh column (11) among the plurality of cells C first become adjacent to the laser scanner LS. The first lasers Laser1 may be sequentially irradiated from the cells C arranged in the eleventh column (11) to cells C arranged in a first column (1). While the display substrate D is moved in the first direction at the constant speed, the first lasers Laser1 may be sequentially irradiated from the cells C arranged in the eleventh column (11) to the cells C arranged in the first column (1) (e.g., motion processing). As another example, when the display substrate D is moved in the first direction at the constant speed and reaches the cells C arranged in the eleventh column (11), the display substrate D stops and the first laser Laser1 may be irradiated to a portion of a processing area AR1 of each of the cells C arranged in the eleventh column (11) (e.g., step processing).

Also, because the first laser Laser1 may be provided as the plurality of first lasers Laser1, cells C arranged in a same column may be concurrently or substantially simultaneously irradiated with the first lasers Laser1 (e.g., respectively). For example, the cells C arranged in the first row among the cells C arranged in the first column may be irradiated with the $(1-1)^{st}$ laser Laser1-1, the cells C arranged in the second row among the cells C arranged in the first column may be irradiated with the $(1-2)^{nd}$ laser Laser1-2, the cells C arranged in the third row among the cells C arranged in the first column may be irradiated with the $(1-3)^{rd}$ laser Laser1-3, and the cells C arranged in the fourth row among the cells C arranged in the first column may be irradiated with the $(1-4)^{th}$ laser Laser1-4. The cells C arranged in the first column may be concurrently or substantially simultaneously irradiated with the first lasers Laser1 so that a portion of each processing area AR1 may be processed, and a first irradiation area AR2 may be formed within a processing area AR1 of each of the cells C arranged in the first column.

The first irradiation area AR2 formed within the processing area AR1 may have a circular shape. The shape of the first irradiation area AR2 may be determined by the laser scanner LS. That is, while the first lasers Laser1 are irradiated to the processing areas AR1 several times at a constant frequency, a direction in which the first laser Laser1 is irradiated may be changed by the laser scanner LS. The first lasers Laser1 irradiated to the processing areas AR1 are accumulated to form the first irradiation area AR2, and the shape of the first irradiation area AR2 may be thereby determined.

Figure 5A:
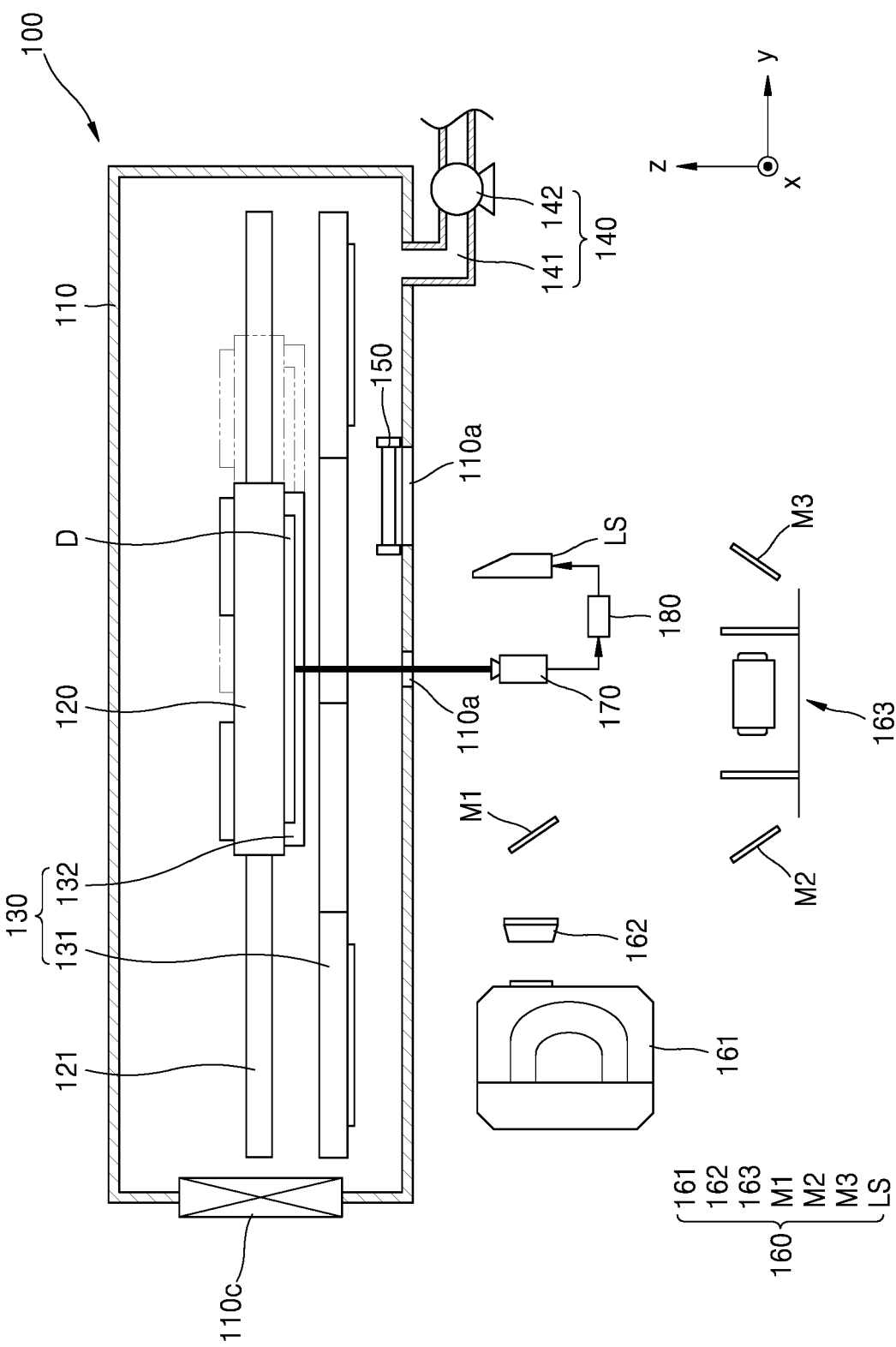
FIG. 5A is a schematic cross-sectional view of a method of manufacturing a display device, according to some embodiments.

Referring to FIG. 5A, after performing the irradiating of the first laser Laser1 to the portion of the processing area AR1 of the display substrate D (S30), the display substrate D may be moved in a second direction (e.g., −y direction), which is opposite to the first direction (e.g., +y direction), at a constant speed. The display substrate D becomes adjacent to the second transmissive window 110b of the chamber 110, and an image of the processing area AR1 of the display substrate D (S40) may be captured using the camera 170. The image of the processing area AR1 obtained using the camera 170 is transmitted to the controller 180, and the controller 180 may analyze the obtained image (e.g., in conjunction with S50). The data analyzed by the controller 180 may be transmitted to the laser scanner LS (e.g., in conjunction with S60).

Figure 5B:
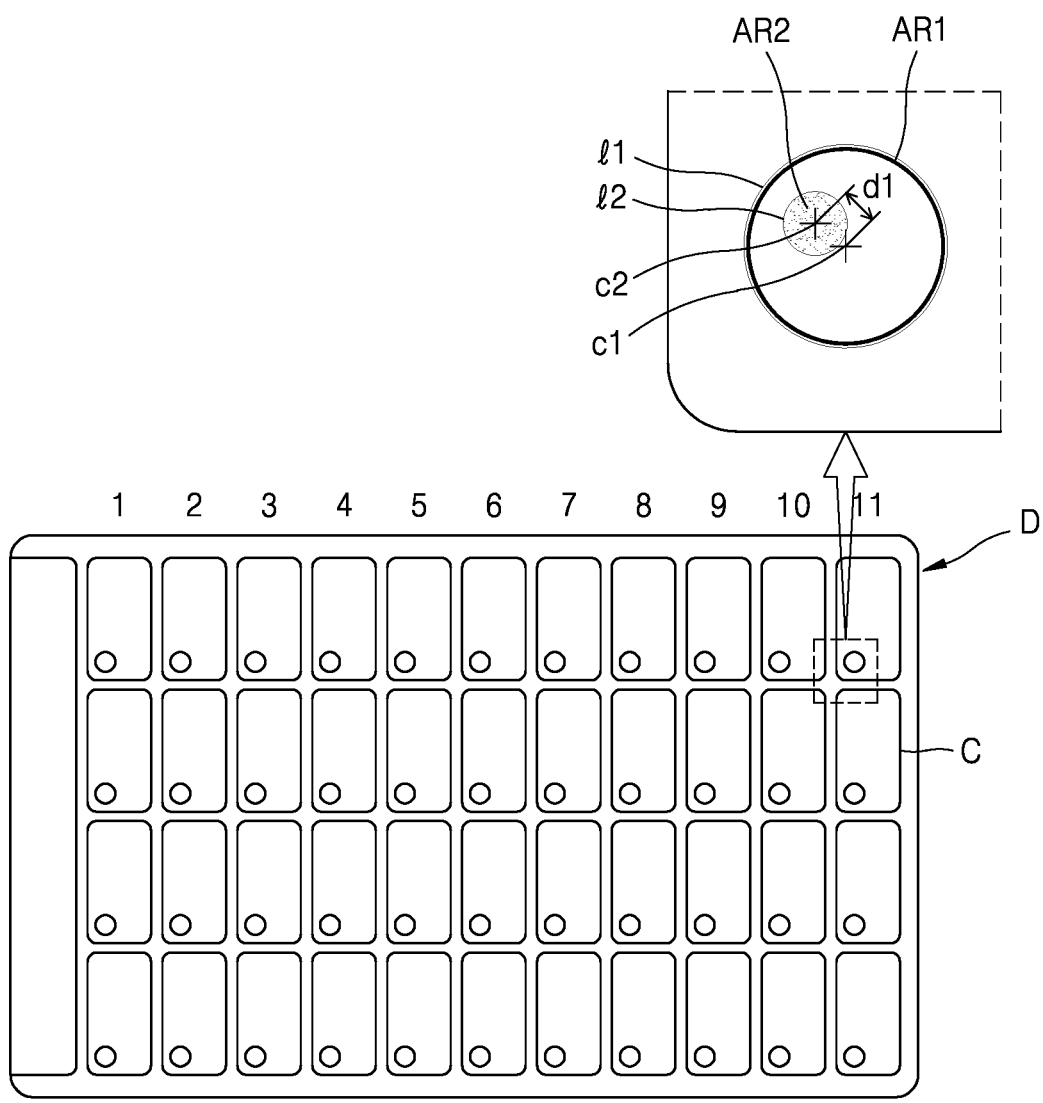
FIG. 5B to 5D are schematic plan views of a method of manufacturing a display device, according to some embodiments.

To describe in detail with reference to FIG. 5B, the display substrate D may include the plurality of cells C arranged in the row direction (y-direction) and in the column direction (x-direction). In some embodiments, the image of the processing area AR1 of the display substrate D may be obtained using the camera 170 or other image-capturing unit or vision unit (S40). An image of the processing area AR1 of each of the plurality of cells C may be obtained using the camera 170. This may maintain the uniformity of the image of the processing area AR1 of each of the plurality of cells C.

When obtaining the image of the processing area AR1 of each of the plurality of cells C using the camera 170, images of processing areas AR1 of respective cells C located in the same column may be sequentially obtained. Also, images of processing areas AR1 of respective cells C located in odd-numbered columns may be sequentially obtained in a third direction (e.g., +x direction), and images of processing areas AR1 of respective cells C located in even-numbered columns among the plurality of cells C may be sequentially obtained in a fourth direction (e.g., −x direction) that is opposite to the third direction (or vice versa). For example, the camera 170 may sequentially obtain images of processing areas AR1 of respective cells C located in a first column among the plurality of cells C while being moved in the third direction (e.g., +x direction), and may be moved to obtain an image of a processing area AR1 of a cells C located in a first row among cells C located in a second column. Thereafter, the camera 170 may sequentially obtain images of processing areas AR1 of respective cells C located in the second column among the plurality of cells C while moving in the fourth direction (e.g., −x direction) that is opposite to the third direction (or vice versa).

Referring to an enlarged view of a portion of FIG. 5B, a process of analyzing a center of a first irradiation area AR2 irradiated with the first laser Laser1 and a center of a processing area AR1 may be performed by using the image obtained using the camera 170. A first line l1 may be drawn according to a shape of the processing area AR1, which is recognized by identifying a location of the processing area AR1, and a first center c1 of the processing area AR1 may be derived via the first line l1. In the same manner, a second line l2 may be drawn according to a shape of the first irradiation area AR2, which is recognized by identifying a location of the first irradiation area AR2, and a second center c2 of the first irradiation area AR2 may be derived via the second line l2.

Next, a first displacement d1 from the second center c2 of the first irradiation area AR2 irradiated with the first laser Laser1 to the first center c1 of the processing area AR1 may be calculated (S50). Through the first displacement d1, the second center c2 of the first irradiation area AR2 irradiated with the first laser Laser1 may be adjusted to match, or to more closely match, the first center c1 of the processing area AR1. The calculated first displacement d1 may be transmitted to the laser scanner LS, and adjusting a location to which a second laser Laser2 (see FIG. 6A) is to be irradiated on the display substrate D based on the first displacement d1 (S60) may be performed.

Figure 5C:
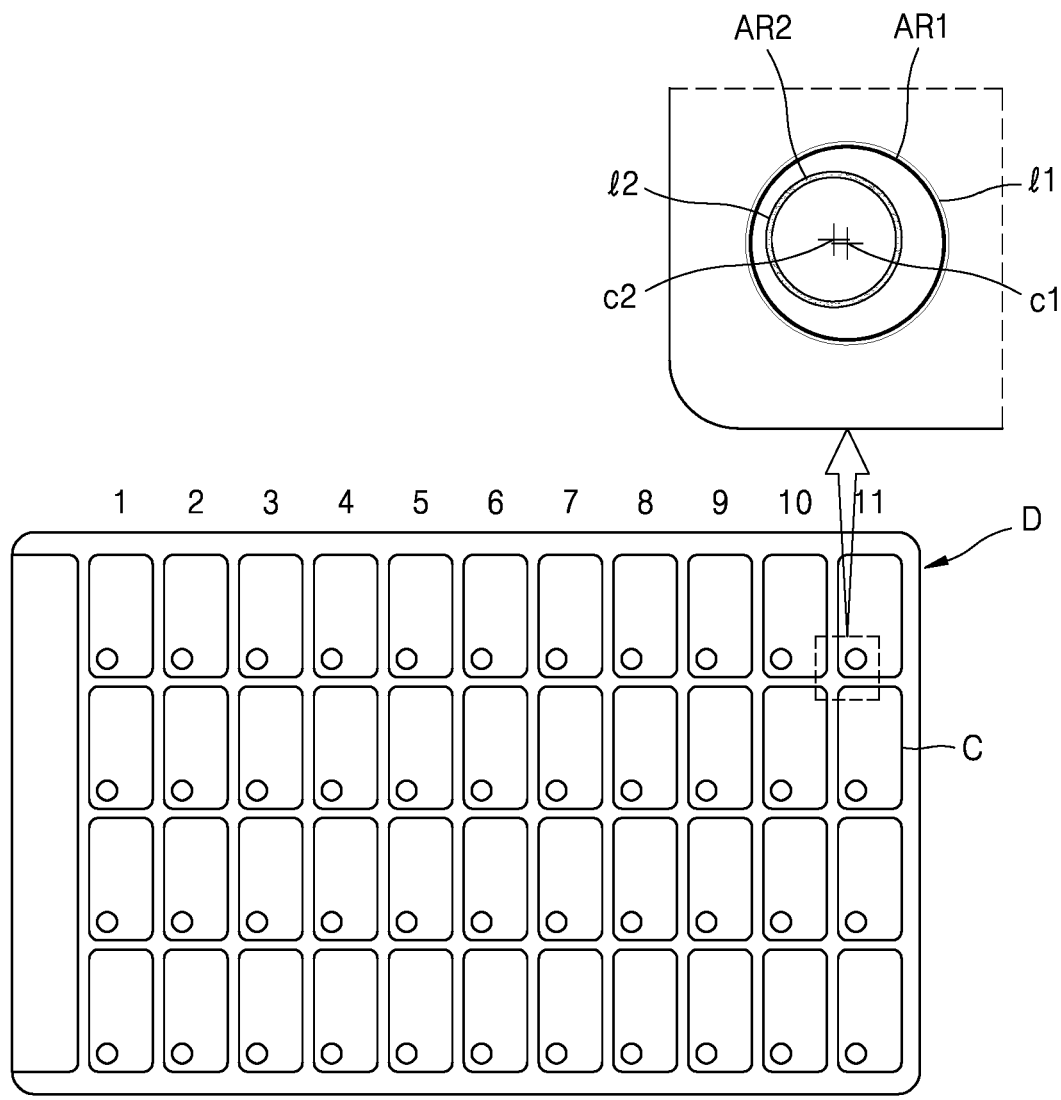
Figure 5D:
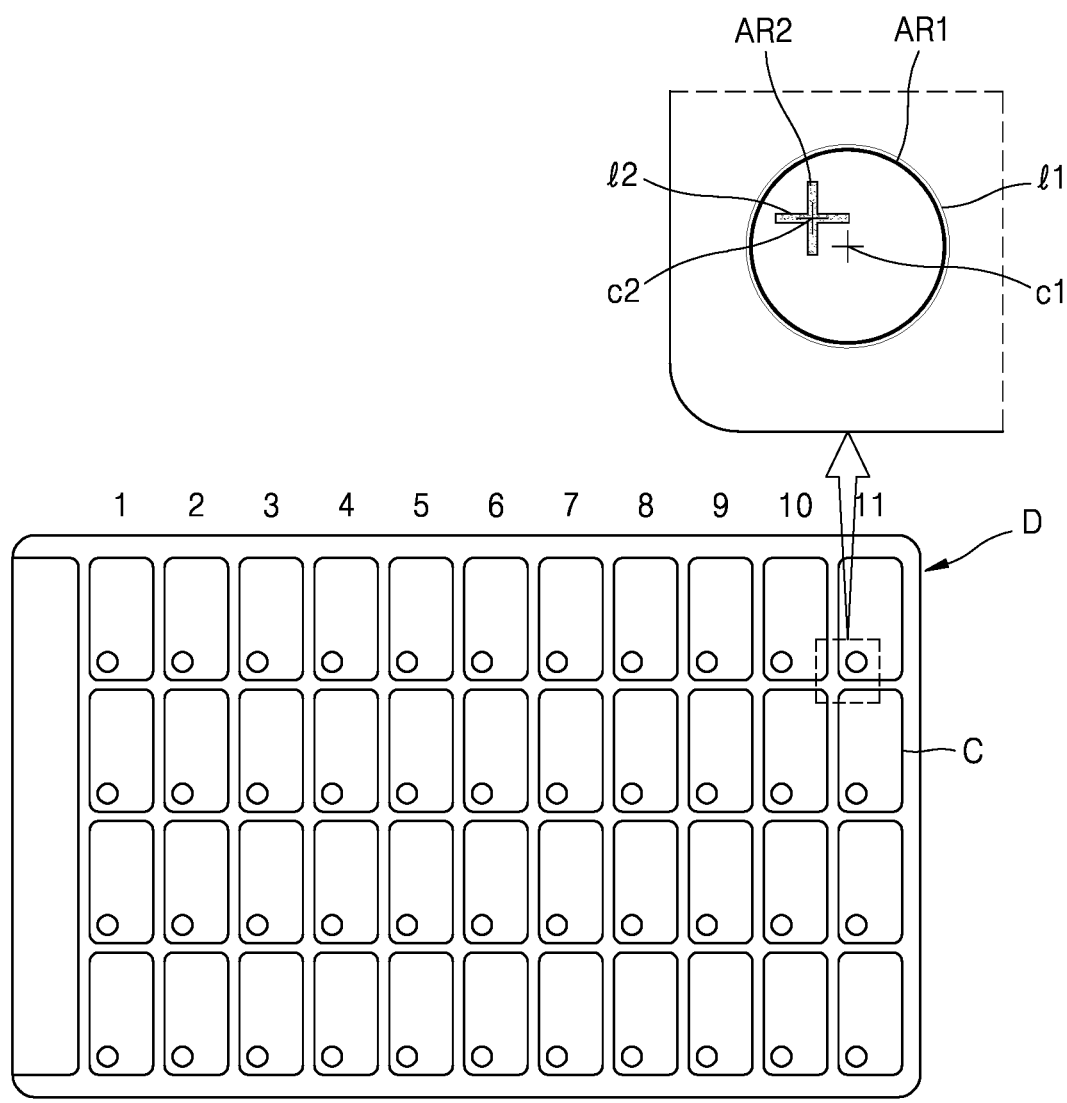

As shown in FIG. 5B, the first irradiation area AR2 may have a circular shape. An edge of the first irradiation area AR2, which may be formed by the first laser Laser1 irradiated several times at a constant frequency, may be circular. As another example, as shown in FIGS. 5C and 5D, respectively, the first irradiation area AR2 may have a ring shape or a cross shape. The shape of the first irradiation area AR2 may be determined by the laser scanner LS.

Even when the first irradiation area AR2 has the ring shape or the cross shape, the second line l2 may be drawn according to the shape of the first irradiation area AR2, as described in FIG. 5B, and the second center c2 of the first irradiation area AR2 may be derived through the second line l2. For example, when the first irradiation area AR2 has the cross shape, the second center c2 of the first irradiation area AR2 may be suitably derived.

Figure 6A:
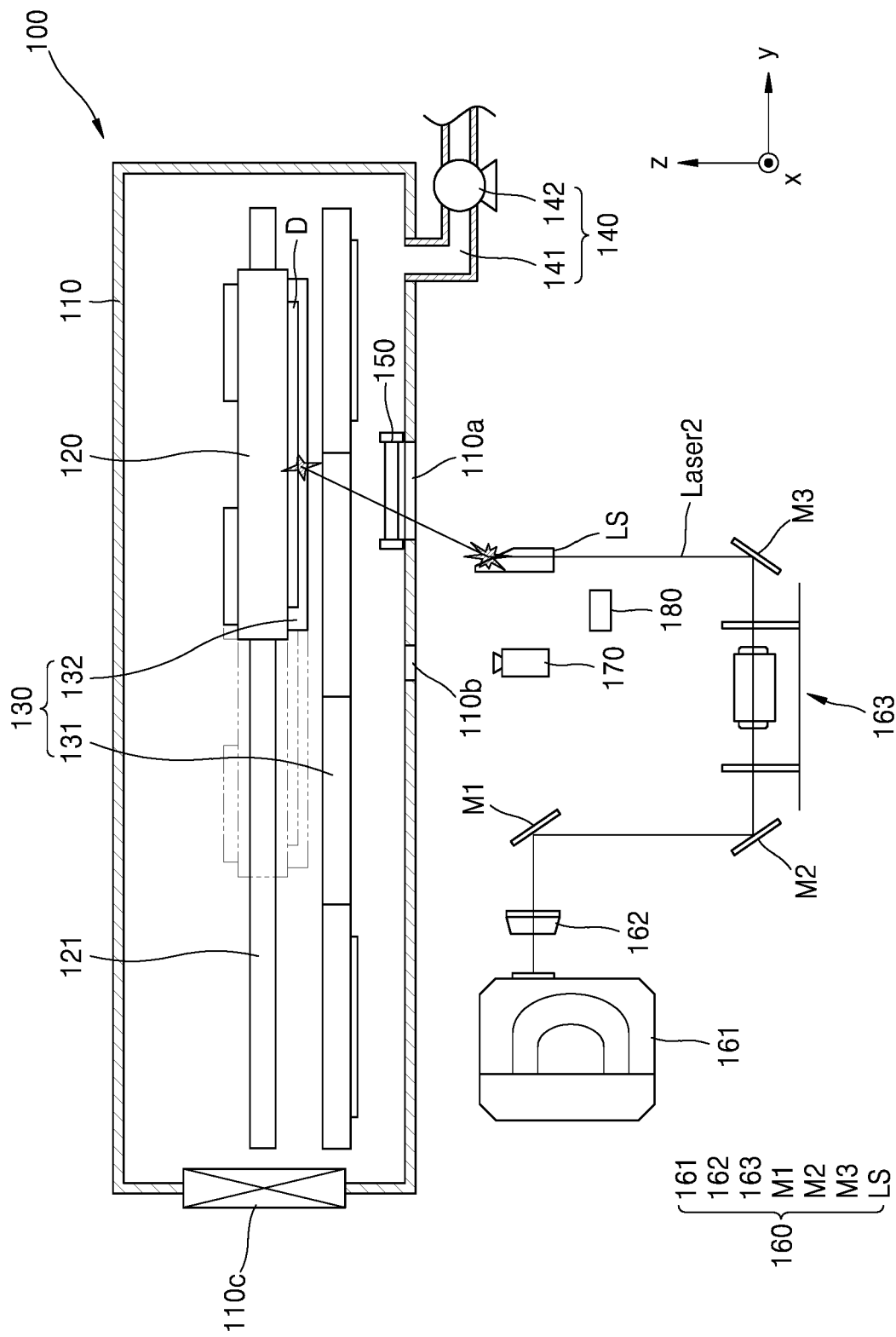
FIG. 6A is a schematic cross-sectional view of a method of manufacturing a display device, according to some embodiments.

Referring to FIG. 6A, after performing the adjusting of the location to which the second laser Laser2 is to be irradiated on the display substrate D based on the first displacement d1 (S60) calculated in FIGS. 5A and 5B, the display substrate D may be moved again in the first direction (e.g., +y direction) at the constant speed. In this case, the first direction may be different from a direction in which the second laser Laser2 is incident on the display substrate D. The display substrate D may become adjacent to the first transmissive window 110a of the chamber 110, and irradiating the second laser Laser2 to a portion of a processing area AR1 of the display substrate D (S70) may be performed. Although FIG. 6A illustrates that the second laser Laser2 passes through the LMS magnet 131, as described in FIG. 1, it may be understood that the transporter 120 is movable using two LMS magnets 131 spaced apart from each other, and the second laser Laser2 may pass through an empty space between the two LMS magnets 131, which are spaced apart from each other.

Figure 6B:
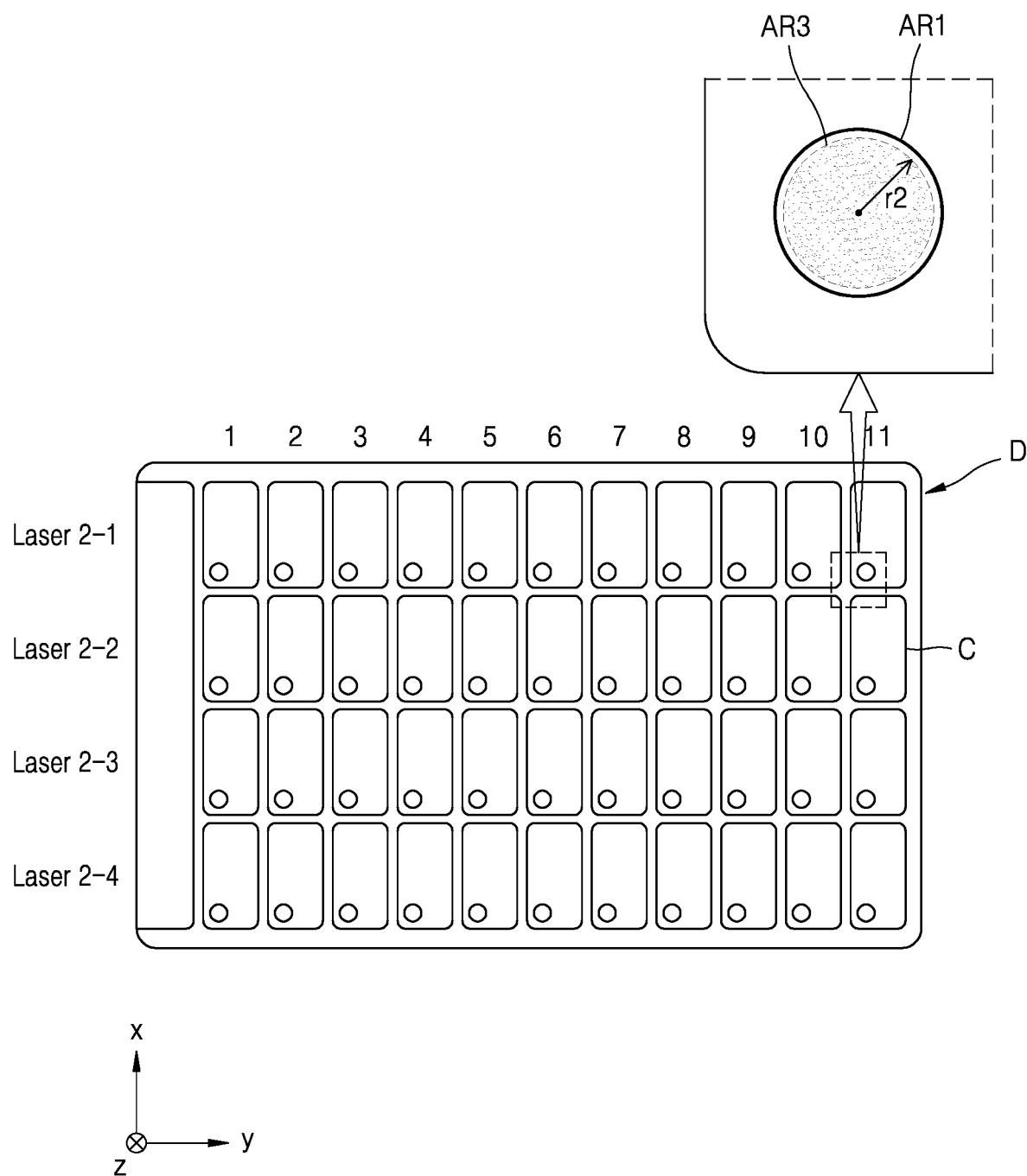
FIG. 6B is a schematic plan view of a method of manufacturing a display device, according to some embodiments.

Before performing the irradiating of the second laser Laser2 to the processing area AR1 of the display substrate D (S70), a frequency at which the second laser Laser2 is emitted and/or an intensity of the second laser Laser2 may be adjusted by the laser light source 161, and/or a shape and/or a quality of the second laser Laser2 may be changed by the optical component 163. Also, a location at which the second laser Laser2 is to be irradiated onto the display substrate D, based on the first displacement d1, may be adjusted by adjusting the galvanometer scanner of the laser scanner LS. That is, the second laser Laser2 may be irradiated to the processing area AR1 of the display substrate D by adjusting the galvanometer scanner of the laser scanner LS. As shown in FIG. 6B, a second irradiation area AR3 may be formed, in which the processing area AR1 of the display substrate D is locally processed by the second laser Laser2.

The irradiating of the second laser Laser2 to the portion of the processing area AR1 of the display substrate D (S70) may be performed while the display substrate D is moved in the first direction (e.g., +y direction) at the constant speed. As another example, when the display substrate D is moved in the first direction at the constant speed and reaches the processing area AR1 of the display substrate D, the display substrate D stops and the second laser Laser2 may be irradiated to the processing area AR1.

Referring to FIG. 6B, the second laser Laser2 may be provided as a plurality of second lasers Laser2. For example, as shown in FIG. 6B, there may be a total of four second lasers Laser2. That is, the second laser Laser2 may include a $(2-1)^{st}$ laser Laser2-1, a $(2-2)^{nd}$ laser Laser2-2, a $(2-3)^{rd}$ laser Laser2-3, and a $(2-4)^{th}$ laser Laser2-4. Also, the display substrate D may include the plurality of cells C arranged in the row direction (y-direction) and in the column direction (x-direction). The plurality of cells C may each include a processing area AR1.

In some embodiments, as shown in FIG. 6B, a plurality of cells C arranged in a first row may be irradiated with the $(2-1)^{st}$ laser Laser2-1, a plurality of cells C arranged in a second row may be irradiated with the $(2-2)^{nd}$ laser Laser2-2, a plurality of cells C arranged in a third row may be irradiated with the $(2-3)^{rd}$ laser Laser2-3, and a plurality of cells C arranged in a fourth row may be irradiated with the $(2-4)^{th}$ laser Laser2-4.

As described in FIG. 6A, the display substrate D may be moved in the first direction (e.g., +y direction) at the constant speed. When the display substrate D is moved in the first direction, cells C arranged in an eleventh column among the plurality of cells C first become adjacent to the laser scanner LS. The second laser Laser2 may be sequentially irradiated from the cells C arranged in the eleventh column to cells C arranged in a first column. While the display substrate D is moved in the first direction at the constant speed, the second lasers Laser2 may be sequentially irradiated from the cells C arranged in the eleventh column to the cells C arranged in the first column (motion processing). As another example, when the display substrate D is moved in the first direction at the constant speed and reaches the cells C arranged in the eleventh column, the display substrate D stops and the second laser Laser2 may be irradiated to a processing area AR1 of each of the cells C arranged in the eleventh column (step processing).

Also, because the second laser Laser2 may be provided as the plurality of second lasers Laser2, cells C arranged in the same column may be concurrently or substantially simultaneously irradiated with the second lasers Laser2. For example, the cell C in the first row and in the first column may be irradiated with the $(2-1)^{st}$ laser Laser2-1, the cell C in the second row and in the first column may be irradiated with the $(2-2)^{nd}$ laser Laser2-2, the cell C in the third row and in the first column may be irradiated with the $(2-3)^{rd}$ laser Laser2-3, and the cell C in the fourth row and in the first column may be irradiated with the $(2-4)^{th}$ laser Laser2-4. The cells C arranged in the first column may be concurrently or substantially simultaneously irradiated with the second lasers Laser2 so that each processing area AR1 may be processed, and a second irradiation area AR3 may be formed within a processing area AR1 of each of the cells C arranged in the first column.

The second irradiation area AR3 formed within the processing area AR1 may have a circular shape. The shape of the second irradiation area AR3 may be determined by the laser scanner LS. That is, while the second lasers Laser2 are irradiated to the processing areas AR1 several times at a constant frequency, a direction in which the second laser Laser2 is irradiated may be changed by the laser scanner LS. The second lasers Laser2 irradiated to the processing areas AR1 are accumulated to form the second irradiation area AR3, and the shape of the second irradiation area AR3 may be thereby formed.

As shown in FIGS. 4B and 6B, the first irradiation area AR2 irradiated with the first laser Laser1 and the second irradiation area AR3 irradiated with the second laser Laser2 may both have a circular shape, and a diameter r1 of the first irradiation area AR2 may be smaller than a diameter r2 of the second irradiation area AR3.

Figure 7A:
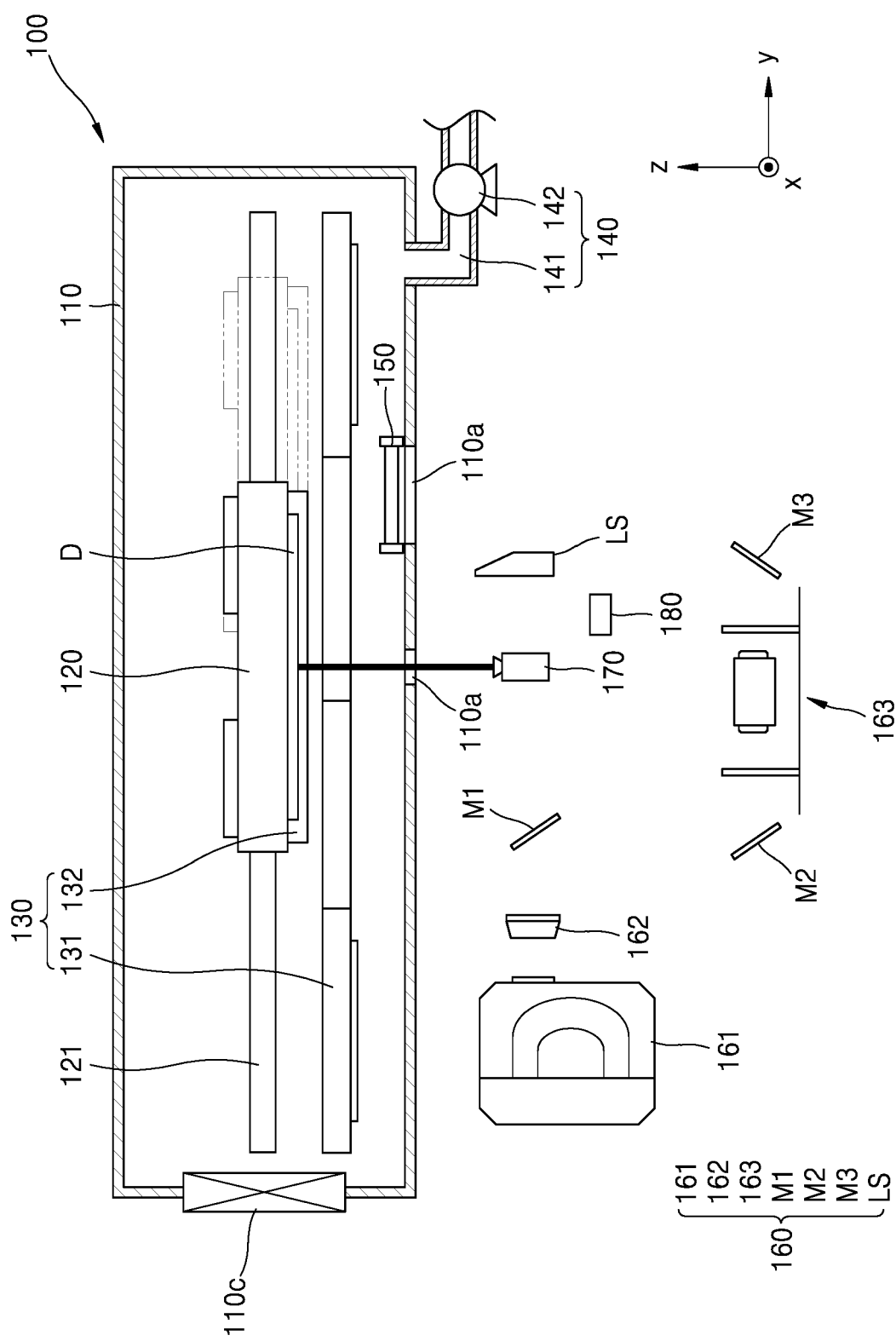
FIG. 7A is a schematic cross-sectional view of a method of manufacturing a display device, according to some embodiments.

Referring to FIG. 7A, after performing the irradiating of the second laser Laser2 to the processing area AR1 of the display substrate D (S70), the display substrate D may be moved in a second direction (e.g., −y direction), which is opposite to the first direction (e.g., +y direction), at a constant speed. The display substrate D becomes adjacent to the second transmissive window 110*b* of the chamber 110, and re-obtaining an image of the processing area AR1 of the display substrate D using the camera 170 (S80) may be performed. The image of the processing area AR1 re-obtained using the camera 170 is transmitted to the controller 180, and the controller 180 may analyze the re-obtained image (e.g., in conjunction with S90). The data analyzed by the controller 180 may be transmitted to the laser scanner LS.

Figure 7B:
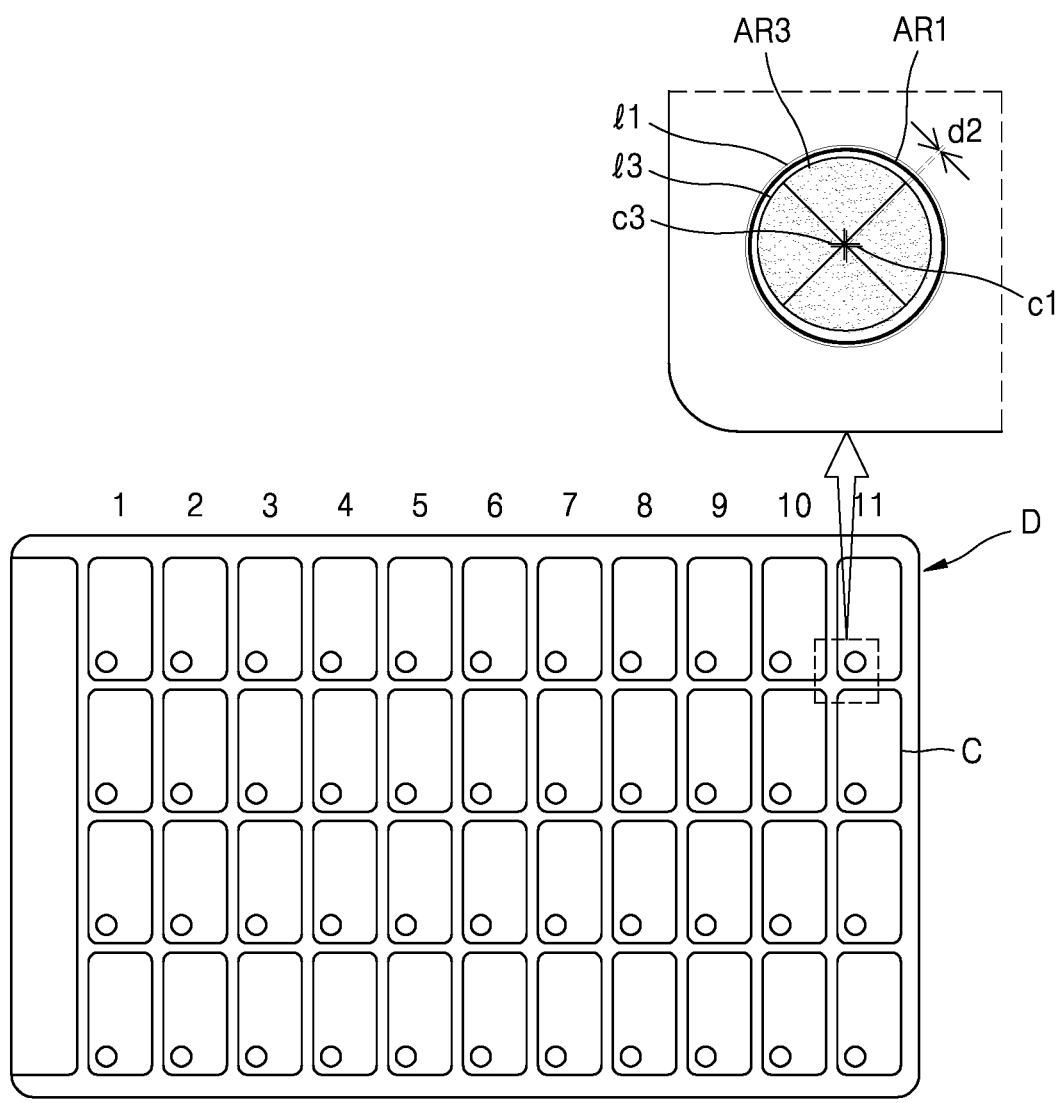
FIG. 7B is a schematic plan view of a method of manufacturing a display device, according to some embodiments.

To describe in detail with reference to FIG. 7B, the display substrate D may include the plurality of cells C arranged in the row direction (y-direction) and the column direction (x-direction). In some embodiments, when re-obtaining the image of the processing area AR1 of the display substrate D, the image may be obtained using the camera 170 or other image-capturing unit or vision unit (S80). An image of the processing area AR1 of each of the plurality of cells C may be re-obtained using the camera 170 to maintain the uniformity of the image of the processing area AR1 of each of the plurality of cells C.

When re-obtaining the image of the processing area AR1 of each of the plurality of cells C using the camera 170, images of processing areas AR1 of respective cells C located in the same column may be sequentially obtained. Also, images of processing areas AR1 of respective cells C located in odd-numbered columns may be sequentially obtained in a third direction (e.g., +x direction), and images of processing areas AR1 of respective cells C located in even-numbered columns may be sequentially obtained in a fourth direction (e.g., −x direction) that opposite to the third direction (or vice versa).

Referring to an enlarged view of a portion of FIG. 7B, a process of analyzing a center of a second irradiation area AR3 irradiated with the second laser Laser2 and a center of a processing area AR1 may be performed by using the image re-obtained using the camera 170. A first line l1 may be drawn according to a shape of the processing area AR1, which is recognized by identifying a location of the processing area AR1, and a first center c1 of the processing area AR1 may be derived via the first line l1. In the same manner, a third line l3 may be drawn according to a shape of the second irradiation area AR3, which is recognized by identifying a location of the second irradiation area AR3, and a third center c3 of the second irradiation area AR3 may be derived via the third line l3.

Next, a second displacement d2 between the third center c3 of the second irradiation area AR3 irradiated with the second laser Laser2 and the first center c1 of the processing area AR1 may be calculated (S90). Through the second displacement d2, the third center c3 of the second irradiation area AR3 irradiated with the second laser Laser2 may be adjusted to match the first center c1 of the processing area AR1. The calculated second displacement d2 may be transmitted to the laser scanner LS, and a location to which a first laser Laser1 (see FIG. 4A) is to be irradiated on another display substrate D may be adjusted based on the second displacement d2.

As described above, the method of manufacturing the display device according to some embodiments may include irradiating the first laser Laser1 to the portion of the processing area AR1 of the display substrate D (S30), obtaining the image of the processing area AR1 of the display substrate D (S40), calculating the displacement between the center of the first irradiation area AR2 irradiated with the first laser Laser1 and the center of the processing area AR1 by using the image of the processing area AR1 (S50), adjusting the location to which the second laser Laser2 is to be irradiated on the display substrate D based on the calculated displacement (S60), and irradiating the second laser Laser2 to the processing area AR1 of the display substrate D (S70).

As a comparative example, before processing a processing area of a display substrate, a preliminary process, such as irradiating a laser to a portion of the processing area, etc. may be omitted. That is, the processing area of the display substrate may be directly processed. As described in FIG. 1, a protective window may be used to protect a transmission window formed in a chamber, and by periodically replacing the protective window, an area corresponding to a path of the laser may be kept clean. However, the replaced protective window may have a thickness that is different from a thickness of the protective window prior to the replacement, and as a result, the path of the laser passing through the protective window may be changed according to a change in a refraction angle, etc. Therefore, when irradiating the laser onto the display substrate as coordinates set prior to the replacement of the protective window, an area irradiated with the laser may be outside of the processing area. When the area irradiated with the laser is outside of the processing area, the display substrate may be subject to disposal, and a defect rate of the display substrate may be increased. In addition, a location to which the laser is irradiated may be changed according to a change in a setting value of a laser light source forming the laser, and the location to which the laser is irradiated may be changed due to damage to an optical component that may occur when a laser with high energy passes through the optical component. As such, there has been an increasing need for a method capable of correcting process changes caused by the replacement of the protective window, the change in the setting value of the laser light source, the damage to the optical component, etc. without disposal of the display substrate.

The method of manufacturing the display device according to some embodiments includes irradiating the first laser Laser1 to the portion of the processing area AR1 of the display substrate D (S30) before processing the processing area AR1, so that process changes caused by the replacement of the protective window, the change in the setting value of the laser light source, the damage to the optical component, etc. may be corrected without disposal of the display substrate D. Preliminary processing may be performed by irradiating the first laser Laser1 to the portion of the processing area AR1 of the display substrate D before processing the processing area AR1, and how far the center of the first irradiation area AR2 that is irradiated with the first laser Laser1 is from the center of the processing area AR1 may be identified before processing the processing area AR1. That is, when processing the processing area AR1, how far the area irradiated with the laser is from the processing area AR1 may be predicted. By calculating the displacement between the center of the first irradiation area AR2 irradiated with the first laser Laser1 and the center of the processing area AR1, during main processing, coordinates of the second laser Laser2 to be irradiated onto the display substrate D may be adjusted, and thus the second irradiation area AR3 irradiated with the second laser Laser2 may be formed within the processing area AR1. Therefore, the frequency of a case in which the area irradiated with the laser is outside of the processing area AR1 is decreased when processing the processing area AR1, and thus the number of display substrates D rejected or subject to disposal may also be decreased (e.g., the defect rate of the display substrate D may be decreased). Also, the processing area AR1 of the display substrate D, which has been preliminarily processed, is processed, and thus there is little to no time required to reload the display substrate D into the chamber 110. Because the area irradiated with the laser is small, the processing speed is not high, and thus the preliminary processing does not significantly affect the processing time.

Figure 8:
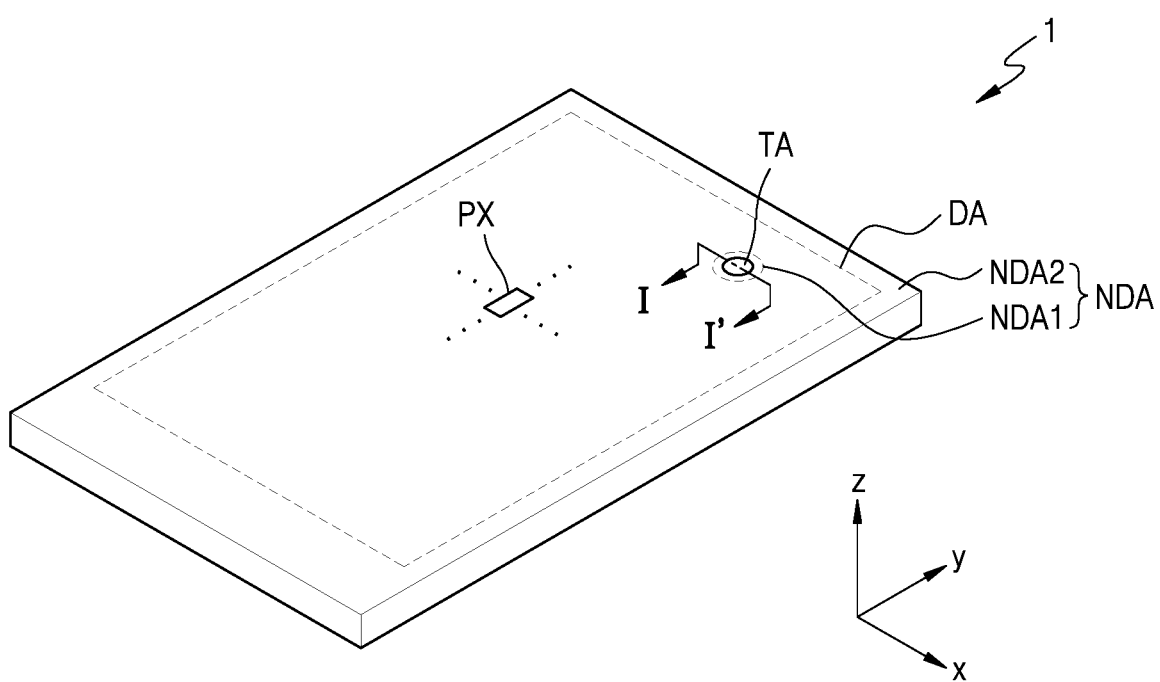
FIG. 8 is a perspective view of a display device manufactured by a method of manufacturing a display device, according to some embodiments.

FIG. 8 is a perspective view of a display device manufactured by a method of manufacturing a display device 1, according to some embodiments.

Referring to FIG. 8, the display device 1 includes a display area DA that emits light, and a non-display area NDA that does not emit light. The non-display area NDA is adjacent to the display area DA. The display device 1 may provide a certain image by using light emitted from a plurality of pixels PX arranged in the display area DA.

The display device 1 includes a transmission area TA at least partially surrounded by the display area DA. In some embodiments, FIG. 8 illustrates that the transmission area TA is entirely surrounded by the display area DA. The non-display area NDA may include a first non-display area NDA1 surrounding the transmission area TA and a second non-display area NDA2 surrounding an outer periphery of the display area DA. The first non-display area NDA1 may entirely surround the transmission area TA, the display area DA may entirely surround the first non-display area NDA1, and the second non-display area NDA2 may entirely surround the display area DA.

The display device 1 according to some embodiments may include various types of display devices, such as an organic light-emitting display, an inorganic light-emitting display, a quantum dot light-emitting display, etc.

The transmission area TA may be formed through the method of manufacturing the display device 1 according to some embodiments. As described in FIGS. 3 through 7B, the processing area AR1 is processed after the preliminary processing, and thus, by using a display substrate D, the transmission area TA may be formed within a processing area AR1 of the display substrate D.

Figure 9A:
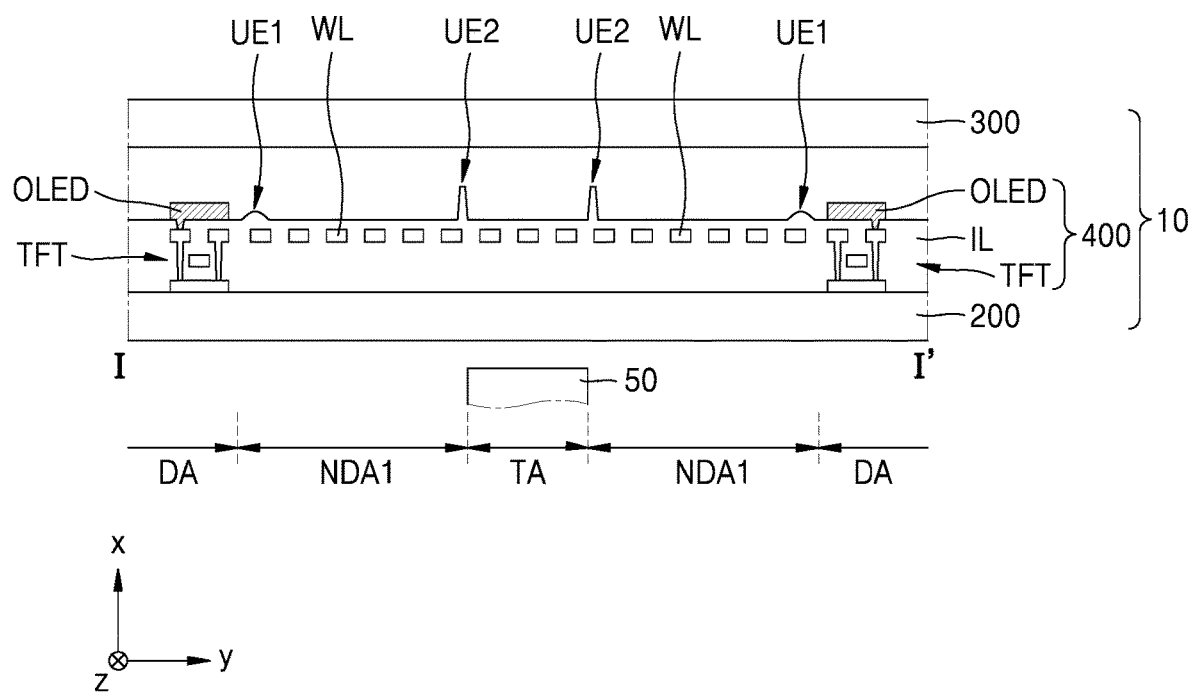
FIG. 9A is a cross-sectional view of a display device taken along the line I-I' of FIG. 8 according to some embodiments.
Figure 9B:
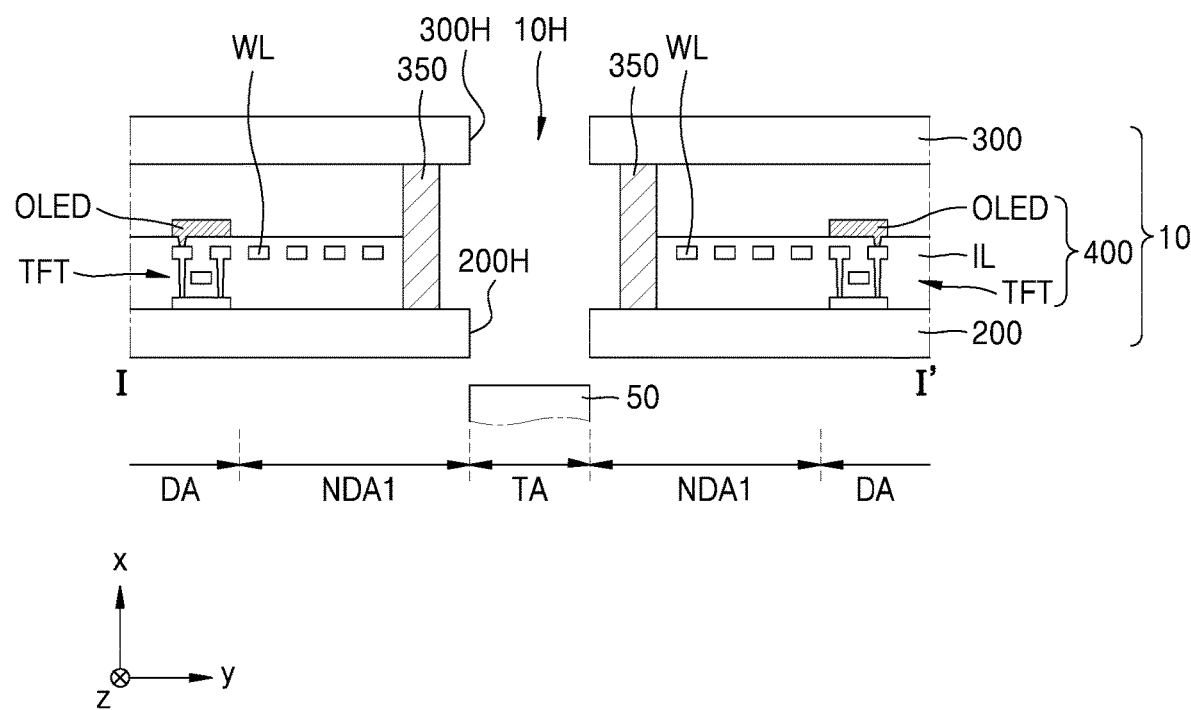
FIG. 9B is a cross-sectional view of a display device taken along the line I-I' of FIG. 8 according to other embodiments.

FIGS. 9A and 9B are schematic cross-sectional views of a display device according to some embodiments, and may correspond to a cross-section of the display device taken along the line I-I' of FIG. 8. FIG. 9B corresponds to some modified embodiments of FIG. 9A, and thus some embodiments will be described based on FIG. 9A, and FIG. 9B will be mainly described with respect to differences from FIG. 9A.

Referring to FIG. 9A, the display device 1 (see FIG. 8) may include a display panel 10 including a display element and a component 50 corresponding to the transmission area TA.

The display panel 10 may include a substrate 200, an encapsulation substrate 300 as an encapsulation member facing the substrate 200, and a display element layer 400 therebetween.

The substrate 200 may include a glass material, a ceramic material, a metallic material, or a flexible or bendable material. The substrate 200 may have a single-layered or multi-layered structure including the above-described material. In the case of the multi-layered structure, the substrate 200 may further include an inorganic layer. In some embodiments, the substrate 200 may have a stacked structure of an organic material/an inorganic material/an organic material.

The encapsulation substrate 300 may be arranged to face the substrate 200 and may include glass or a polymer resin.

The display element layer 400 may include a circuit layer including a thin-film transistor TFT, an organic light-emitting diode OLED as a display element connected to the thin-film transistor TFT, and an insulating layer IL therebetween. The thin-film transistor TFT and the organic light-emitting diode OLED connected thereto may be arranged in the display area DA, and some wires WL of the display element layer 400 may be located in the first non-display area NDA1 and/or the transmission area TA.

The insulating layer IL may include a first uneven portion UE1 between the display area DA and the first non-display area NDA1, and a second uneven portion UE2 between the first non-display area NDA1 and the transmission area TA. The first uneven portion UE1 and the second uneven portion UE2 may be formed on the insulating layer IL corresponding to the first non-display area NDA1.

Although FIG. 9A illustrates that first uneven portions UE1 are respectively arranged in a left first non-display area NDA1 and a right first non-display area NDA1 with respect to the transmission area TA, when viewed in a direction perpendicular to a main surface of the substrate 200, it may be understood that the first non-display area NDA1 is entirely surrounded by the first uneven portion UE1. Although some embodiments have been described based on the first uneven portion UE1, the same applies to the second uneven portion UE2. That is, when viewed in the direction perpendicular to the main surface of the substrate 200, it may be understood that the transmission area TA is entirely surrounded by the second uneven portion UE2.

The first uneven portion UE1 and the second uneven portion UE2 may function to distinguish the transmission area TA, the first non-display area NDA1, and the display area DA from one another. For example, the second uneven portion UE2 may correspond to a thick boundary line indicating the processing area AR1 illustrated in FIG. 4B. A location of the processing area AR1 may be identified by the second uneven portion UE2, and as described in FIGS. 2 through 7B, a laser may be irradiated within the processing area AR1. As shown in FIG. 9A, a height of the second uneven portion UE2 may be higher than a height of the first uneven portion UE1. An end of the second uneven portion UE2 may have a sharp shape. The processing area AR1 and a non-processing area may be easily distinguished from one another by the second uneven portion UE2.

The transmission area TA of FIG. 2 may be formed by irradiating the laser within the processing area AR1 of FIG. 4B, and the organic light-emitting diode OLED, which is an organic layer located to correspond to the transmission area TA, may be removed. As the organic layer corresponding to the transmission area TA is removed by the laser, light transmittance for an electronic element may be secured.

Although FIG. 9A illustrates that the substrate 200 and the encapsulation substrate 300 do not include a through hole, as shown in FIG. 9B, the display panel 10 may include a through hole 10H corresponding to the transmission area TA. For example, the substrate 200 and the encapsulation substrate 300 may respectively include through holes 200H and 300H corresponding to the transmission area TA. The display element layer 400 may also include a through hole corresponding to the transmission area TA.

A sealant 350 covering a side surface of the display element layer 400 may be between the substrate 200 and the encapsulation substrate 300. Although FIG. 9A illustrates that the sealants 350 are arranged on both sides of the transmission area TA, when viewed in the direction perpendicular to the main surface of the substrate 200, it may be understood that the transmission area TA is entirely surrounded by the sealants 350.

The wires WL may be configured to provide a certain signal or voltage to pixels spaced apart from each other with the transmission area TA therebetween. Although FIG. 9A illustrates that the wires WL do not overlap the sealant 350 in the first non-display area NDA1, as another example, a portion of the sealant 350 may also be arranged on the wires WL. Also, although FIG. 9B illustrates that the wires WL are spaced apart from each other with the transmission area TA therebetween, when viewed in the direction perpendicular to the main surface of the substrate 200, the wires WL may be arranged to bypass the transmission area TA. As another example, as shown in FIG. 9A, the wires WL may be arranged to correspond to the transmission area TA.

In some embodiments, elements may be further arranged on the display panel 10, such as an input sensing member that senses a touch input, a reflection prevention member including a polarizer and a retarder, or a color filter and a black matrix, and a transparent window.

The component 50 may be located in the transmission area TA. The component 50 may be an electronic element using light or sound. For example, the electronic element may include a sensor that receives light, such as an infrared sensor, a camera that captures an image by receiving light, a sensor that outputs and detects light and/or sound to measure distance and/or recognize fingerprints, a small lamp that outputs light, a speaker that outputs sound, and the like. In the case of an electronic element using light, light of various wavelength bands, such as visible light, infrared light, ultraviolet light, and the like, may be used. As shown in FIG. 9B, when the display panel 10 includes the through hole 10H corresponding to the transmission area TA, light or sound output or received from the electronic element may be more effectively received or used.

Unlike the display panel 10 including the through hole 10H corresponding to the transmission area TA, as shown in FIG. 9B, some elements of the display panel 10 may not include a through hole. For example, the encapsulation substrate 300 includes the through hole 300H corresponding to the transmission area TA, but the substrate 200 might omit a through hole in other embodiments. As another example, the substrate 200 and the encapsulation substrate 300 may both omit a through hole corresponding to the transmission area TA in other embodiments. Even when the substrate 200 does not include the through hole 200H, portions of the display element layer 400 corresponding to the transmission area TA may be removed, thereby securing light transmittance for the electronic element.

Although FIGS. 9A and 9B illustrate that the component 50 is located in a lower portion of the display panel 10, that is, on one side of the substrate 200, the component 50 may be at least partially inserted into the through hole 10H so as to overlap side surfaces of the display panel 10 that define the through hole 10H.

The component 50 may be a member other than the aforementioned electronic element. In some embodiments, when the display panel 10 is used as a smart watch or a vehicle instrument panel, the component 50 may be a member including a clock needle (e.g., corresponding to watch hands) or a needle indicating certain information (e.g., vehicle speed, etc.). Alternatively, the component 50 may include an element such as an accessory that increases the aesthetics of the display panel 10.

The transmission area TA may be formed through the method of manufacturing the display device according to some embodiments. As described in FIGS. 3 through 7B, the processing area AR1 is processed after the preliminary processing, and thus the transmission area TA may be formed within a processing area AR1 of the display substrate D. As such, because the transmission area TA is precisely processed, the transmittance in the transmission area TA may be increased, and a wavelength bandwidth of light reaching the component 50 corresponding to the transmission area TA may be widened. For example, when the component 50 is a camera that receives light to capture an image, the captured image may be clearer as the wavelength bandwidth of the light reaching the component 50 is wider.

As described above, the transmission area TA may be formed by the method of manufacturing the display device 1 according to some embodiments. In addition, the method may be variously used in a process of processing by irradiating a laser, such as removing an organic layer included in the display device 1.

According to the embodiments as described above, the method of manufacturing the display device may be implemented in which a defective rate of a display substrate is reduced by, prior to main processing, irradiating a laser to a portion of a processing area of a display substrate, and predicting and correcting a location to which the laser is irradiated. However, the scope of the disclosure is not limited by the above effects.

It should be understood that embodiments described herein should be considered in a descriptive sense only and not for purposes of limitation. Descriptions of aspects within the disclosed embodiments should typically be considered as available for other similar aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A method of manufacturing a display device, the method comprising:
    irradiating a first laser to a first irradiation area of a processing area of a display substrate;
    obtaining a first image of the processing area of the display substrate;
    calculating a first displacement between a center of the first irradiation area irradiated with the first laser and a center of the processing area by using the first image;
    determining a second irradiation area to which a second laser is to be irradiated on the display substrate based on the first displacement; and
    irradiating the second laser to the second irradiation area.

2. The method of claim 1, further comprising obtaining a second image showing the second irradiation area.

3. The method of claim 2, further comprising calculating a second displacement between a center of the second irradiation area and the center of the processing area using the second image.

4. The method of claim 1, wherein the first irradiation area and the second irradiation area have a circular shape.

5. The method of claim 4, wherein a diameter of the first irradiation area is smaller than a diameter of the second irradiation area.

6. The method of claim 1, further comprising determining shapes of the first irradiation area and the second irradiation area by changing directions in which the first laser and the second laser are irradiated.

7. The method of claim 1, wherein the first irradiation area has a ring shape or a cross shape.

8. The method of claim 1, wherein the display substrate comprises cells,
    wherein the first laser is provided as a plurality of first lasers, and
    wherein the irradiating of the first laser to the first irradiation area comprises substantially simultaneously irradiating the plurality of first lasers to cells located in a first column among the cells.

9. The method of claim 8, wherein the second laser is provided as a plurality of second lasers, and
    wherein the irradiating of the second laser to the second irradiation area comprises substantially simultaneously irradiating the plurality of second lasers to the cells located in the first column.

10. The method of claim 8, wherein the obtaining of the first image of the processing area comprises sequentially obtaining a plurality of first images of areas of the cells in the first column.

11. The method of claim 10, further comprising:
    sequentially in a first direction obtaining the first images of areas of the cells in the first column; and
    sequentially in a second direction obtaining the first images of areas of the cells in a second column among the cells,
    wherein the second direction is opposite to the first direction.

12. The method of claim 1, further comprising determining the second irradiation area using a laser scanner.

13. The method of claim 1, further comprising moving the display substrate in a third direction that is different from a direction in which one of the first laser or the second laser is incident on a surface of the display substrate.

14. The method of claim 13, further comprising irradiating one of the first laser or the second laser onto the display substrate while the display substrate is moved in the third direction.

15. The method of claim 13, further comprising obtaining the first image while moving the display substrate in a fourth direction that is opposite to the third direction.

16. A method of manufacturing a display device, the method comprising:
    irradiating a first laser to a first irradiation area of a processing area of a display substrate, which is attached to a lower surface of a transporter, by using a processor;
    obtaining a first image of the processing area by using a camera located in a first direction with respect to the processor;
    calculating a first displacement between a center of the first irradiation area and a center of the processing area by using the first image;
    transmitting the first displacement to the processor;

determining, by the processor, a second irradiation area to which a second laser is to be irradiated on the display substrate based on the first displacement; and irradiating the second laser to the second irradiation area.

17. The method of claim 16, wherein the first laser and the second laser are irradiated onto a surface of the display substrate through a protective window between the processor and the display substrate.

18. The method of claim 16, wherein the processor comprises a light source and a laser scanner, and wherein the laser scanner is adjusted based on the first displacement transmitted by the camera.

19. The method of claim 16, further comprising moving the display substrate in the first direction using the transporter, wherein the obtaining of the first image is performed while the display substrate is moved in the first direction.

20. The method of claim 16, wherein the processor comprises a light source and a laser scanner, and wherein shapes of the first irradiation area and the second irradiation area are determined by the laser scanner.

21. The method of claim 16, wherein the first irradiation area has one of a circular shape, a ring shape, or a cross shape.

22. The method of claim 16, wherein the first irradiation area and the second irradiation area have a circular shape, and wherein a diameter of the first irradiation area is smaller than a diameter of the second irradiation area.

23. The method of claim 16, further comprising:

obtaining a second image of the processing area of the display substrate by using the camera; and calculating a second displacement between a center of a second irradiation area irradiated with the second laser and the center of the processing area by using the second image.

* * * * *